(12) United States Patent
Kaup et al.

(10) Patent No.: US 10,408,889 B2
(45) Date of Patent: *Sep. 10, 2019

(54) APPARATUS AND METHOD FOR RECOVERY OF THREE DIMENSIONAL MAGNETIC FIELD FROM A MAGNETIC DETECTION SYSTEM

(71) Applicant: Lockheed Martin Corporation, Bethesda, MD (US)

(72) Inventors: Peter G. Kaup, Marlton, NJ (US); Arul Manickam, Mount Laurel, NJ (US)

(73) Assignee: LOCKHEED MARTIN CORPORATION, Bethesda, MD (US)

(*) Notice: Subject to any disclaimer, the term of this patent is extended or adjusted under 35 U.S.C. 154(b) by 281 days.

This patent is subject to a terminal disclaimer.

(21) Appl. No.: 15/400,794

(22) Filed: Jan. 6, 2017

(65) Prior Publication Data

US 2017/0115361 A1 Apr. 27, 2017

Related U.S. Application Data

(63) Continuation of application No. 15/003,718, filed on Jan. 21, 2016, now Pat. No. 9,541,610.

(Continued)

(51) Int. Cl.
*G01R 33/032* (2006.01)

(52) U.S. Cl.
CPC .................. *G01R 33/032* (2013.01)

(58) Field of Classification Search
CPC ...................................... G01R 33/02
See application file for complete search history.

(56) References Cited

U.S. PATENT DOCUMENTS 2,746,027 A 5/1956 Murray
3,359,812 A 12/1967 Everitt
(Continued)

FOREIGN PATENT DOCUMENTS

CN 105738845 A 7/2016
CN 106257602 12/2016
(Continued)

OTHER PUBLICATIONS

U.S. Notice of Allowance dated Oct. 19, 2017, from related U.S. Appl. No. 15/179,957, 5 pages.
(Continued)

*Primary Examiner* — Reena Aurora
(74) *Attorney, Agent, or Firm* — Foley & Lardner LLP

(57) ABSTRACT

A system for magnetic detection of an external magnetic field is disclosed. The system includes a nitrogen vacancy (NV) diamond material comprising a plurality of NV centers, a magnetic field generator that generates a magnetic field, a radio frequency (RF) excitation source that provides RF excitation, an optical excitation source that provides optical excitation, an optical detector that receives an optical signal emitted by the NV diamond material, and a controller. The controller is configured to calculate a control magnetic field, control the magnetic field generator to generate the control magnetic field, receive a light detection signal from the optical detector based on the optical signal due to the sum of the generated control magnetic field and the external magnetic field, store measurement data based on the received light detection signal, and calculate a vector of the external magnetic field based on the stored measurement data.

38 Claims, 8 Drawing Sheets

Related U.S. Application Data

(60) Provisional application No. 62/112,071, filed on Feb. 4, 2015.

(56) References Cited

U.S. PATENT DOCUMENTS

| | | |
|---|---|---|
| 3,389,333 A | 6/1968 | Wolff et al. |
| 3,490,032 A | 1/1970 | Zurflueh |
| 3,514,723 A | 5/1970 | Cutler |
| 3,518,531 A | 6/1970 | Huggett |
| 3,621,380 A | 11/1971 | Barlow, Jr. |
| 3,745,452 A | 7/1973 | Osburn et al. |
| 3,899,758 A | 8/1975 | Maier et al. |
| 4,025,873 A | 5/1977 | Chilluffo |
| 4,047,805 A | 9/1977 | Sekimura |
| 4,078,247 A | 3/1978 | Albrecht |
| 4,084,215 A | 4/1978 | Willenbrock |
| 4,322,769 A | 3/1982 | Cooper |
| 4,329,173 A | 5/1982 | Culling |
| 4,359,673 A | 11/1982 | Bross et al. |
| 4,368,430 A | 1/1983 | Dale et al. |
| 4,410,926 A | 10/1983 | Hafner et al. |
| 4,437,533 A | 3/1984 | Bierkarre et al. |
| 4,514,083 A | 4/1985 | Fukuoka |
| 4,588,993 A | 5/1986 | Babij et al. |
| 4,636,612 A | 1/1987 | Cullen |
| 4,638,324 A | 1/1987 | Hannan |
| 4,675,522 A | 6/1987 | Arunkumar |
| 4,768,962 A | 9/1988 | Kupfer et al. |
| 4,818,990 A | 4/1989 | Fernandes |
| 4,820,986 A | 4/1989 | Mansfield et al. |
| 4,945,305 A | 7/1990 | Blood |
| 4,958,328 A | 9/1990 | Stubblefield |
| 4,982,158 A | 1/1991 | Nakata et al. |
| 5,019,721 A | 5/1991 | Martens et al. |
| 5,038,103 A | 8/1991 | Scarzello et al. |
| 5,113,136 A | 5/1992 | Hayashi et al. |
| 5,134,369 A | 7/1992 | Lo et al. |
| 5,189,368 A | 2/1993 | Chase |
| 5,200,855 A | 4/1993 | Meredith et al. |
| 5,210,650 A | 5/1993 | O'Brien et al. |
| 5,245,347 A | 9/1993 | Bonta et al. |
| 5,252,912 A | 10/1993 | Merritt et al. |
| 5,301,096 A | 4/1994 | Klontz et al. |
| 5,384,109 A | 1/1995 | Klaveness et al. |
| 5,395,802 A | 3/1995 | Kiyota et al. |
| 5,396,802 A | 3/1995 | Moss |
| 5,420,549 A | 5/1995 | Prestage |
| 5,425,179 A | 6/1995 | Nickel et al. |
| 5,427,915 A | 6/1995 | Ribi et al. |
| 5,548,279 A | 8/1996 | Gaines |
| 5,568,516 A | 10/1996 | Strohallen et al. |
| 5,586,069 A | 12/1996 | Dockser |
| 5,597,762 A | 1/1997 | Popovici et al. |
| 5,638,472 A | 6/1997 | Van Delden |
| 5,694,375 A | 12/1997 | Woodall |
| 5,719,497 A | 2/1998 | Veeser et al. |
| 5,731,996 A | 3/1998 | Gilbert |
| 5,764,061 A | 6/1998 | Asakawa et al. |
| 5,818,352 A | 10/1998 | McClure |
| 5,846,708 A | 12/1998 | Hollis et al. |
| 5,888,925 A | 3/1999 | Smith et al. |
| 5,894,220 A | 4/1999 | Wellstood et al. |
| 5,907,420 A | 5/1999 | Chraplyvy et al. |
| 5,907,907 A | 6/1999 | Ohtomo et al. |
| 5,915,061 A | 6/1999 | Vanoli |
| 5,995,696 A | 11/1999 | Miyagi et al. |
| 6,042,249 A | 3/2000 | Spangenberg |
| 6,057,684 A | 5/2000 | Murakami et al. |
| 6,064,210 A | 5/2000 | Sinclair |
| 6,121,053 A | 9/2000 | Kolber et al. |
| 6,124,862 A | 9/2000 | Boyken et al. |
| 6,130,753 A | 10/2000 | Hopkins et al. |
| 6,144,204 A | 11/2000 | Sementchenko |
| 6,195,231 B1 | 2/2001 | Sedlmayr et al. |
| 6,215,303 B1 | 4/2001 | Weinstock et al. |
| 6,262,574 B1 | 7/2001 | Cho et al. |
| 6,360,173 B1 | 3/2002 | Fullerton |
| 6,398,155 B1 | 6/2002 | Hepner et al. |
| 6,433,944 B1 | 8/2002 | Nagao et al. |
| 6,437,563 B1 | 8/2002 | Simmonds et al. |
| 6,472,651 B1 | 10/2002 | Ukai |
| 6,472,869 B1 | 10/2002 | Upschulte et al. |
| 6,504,365 B2 | 1/2003 | Kitamura |
| 6,518,747 B2 | 2/2003 | Sager et al. |
| 6,542,242 B1 | 4/2003 | Yost et al. |
| 6,621,377 B2 | 9/2003 | Osadchy et al. |
| 6,621,578 B1 | 9/2003 | Mizoguchi |
| 6,636,146 B1 | 10/2003 | Wehoski |
| 6,686,696 B2 | 2/2004 | Mearini et al. |
| 6,690,162 B1 | 2/2004 | Schopohl et al. |
| 6,765,487 B1 | 7/2004 | Holmes et al. |
| 6,788,722 B1 | 9/2004 | Kennedy et al. |
| 6,809,829 B1 | 10/2004 | Takata et al. |
| 7,118,657 B2 | 10/2006 | Golovchenko et al. |
| 7,221,164 B1 | 5/2007 | Barringer |
| 7,277,161 B2 | 10/2007 | Claus |
| 7,305,869 B1 | 12/2007 | Berman et al. |
| 7,307,416 B2 | 12/2007 | Islam et al. |
| 7,342,399 B1 | 3/2008 | Wiegert |
| RE40,343 E | 5/2008 | Anderson |
| 7,400,142 B2 | 7/2008 | Greelish |
| 7,413,011 B1 | 8/2008 | Chee et al. |
| 7,427,525 B2 | 9/2008 | Santori et al. |
| 7,448,548 B1 | 11/2008 | Compton |
| 7,471,805 B2 | 12/2008 | Goldberg |
| 7,474,090 B2 | 1/2009 | Islam et al. |
| 7,543,780 B1 | 6/2009 | Marshall et al. |
| 7,546,000 B2 | 6/2009 | Spillane et al. |
| 7,570,050 B2 | 8/2009 | Sugiura |
| 7,608,820 B1 | 10/2009 | Berman et al. |
| 7,705,599 B2 | 4/2010 | Strack et al. |
| 7,741,936 B1 | 6/2010 | Weller et al. |
| 7,805,030 B2 | 9/2010 | Bratkovski et al. |
| 7,868,702 B2 | 1/2011 | Ohnishi |
| 7,889,484 B2 | 2/2011 | Choi |
| 7,916,489 B2 | 3/2011 | Okuya |
| 7,932,718 B1 | 4/2011 | Wiegert |
| 7,983,812 B2 | 7/2011 | Potter |
| 8,022,693 B2 | 9/2011 | Meyersweissflog |
| 8,120,351 B2 | 2/2012 | Rettig et al. |
| 8,120,355 B1 | 2/2012 | Stetson |
| 8,124,296 B1 | 2/2012 | Fischel |
| 8,138,756 B2 | 3/2012 | Barclay et al. |
| 8,193,808 B2 | 6/2012 | Fu et al. |
| 8,294,306 B2 | 10/2012 | Kumar et al. |
| 8,310,251 B2 | 11/2012 | Orazem |
| 8,311,767 B1 | 11/2012 | Stetson |
| 8,334,690 B2 | 12/2012 | Kitching et al. |
| 8,415,640 B2 | 4/2013 | Babinec et al. |
| 8,471,137 B2 | 6/2013 | Adair et al. |
| 8,480,653 B2 | 7/2013 | Birchard et al. |
| 8,525,516 B2 | 9/2013 | Le Prado et al. |
| 8,547,090 B2 | 10/2013 | Lukin et al. |
| 8,574,536 B2 | 11/2013 | Boudou et al. |
| 8,575,929 B1 | 11/2013 | Wiegert |
| 8,686,377 B2 | 4/2014 | Twitchen et al. |
| 8,704,546 B2 | 4/2014 | Konstantinov |
| 8,758,509 B2 | 6/2014 | Twitchen et al. |
| 8,803,513 B2 | 8/2014 | Hosek et al. |
| 8,854,839 B2 | 10/2014 | Cheng et al. |
| 8,885,301 B1 | 11/2014 | Heidmann |
| 8,913,900 B2 | 12/2014 | Lukin et al. |
| 8,933,594 B2 | 1/2015 | Kurs |
| 8,947,080 B2 | 2/2015 | Lukin et al. |
| 8,963,488 B2 | 2/2015 | Campanella et al. |
| 9,103,873 B1 | 8/2015 | Martens et al. |
| 9,157,859 B2 | 10/2015 | Walsworth et al. |
| 9,245,551 B2 | 1/2016 | El Hallak et al. |
| 9,249,526 B2 | 2/2016 | Twitchen et al. |
| 9,270,387 B2 | 2/2016 | Wolfe et al. |
| 9,291,508 B1 | 3/2016 | Biedermann et al. |
| 9,317,811 B2 | 4/2016 | Scarsbrook |
| 9,369,182 B2 | 6/2016 | Kurs et al. |
| 9,442,205 B2 | 9/2016 | Geiser et al. |

(56) References Cited

U.S. PATENT DOCUMENTS

| | | |
|---|---|---|
| 9,541,610 B2 | 1/2017 | Kaup et al. |
| 9,551,763 B1 | 1/2017 | Hahn et al. |
| 9,557,391 B2 | 1/2017 | Egan et al. |
| 9,570,793 B2 | 2/2017 | Borodulin |
| 9,590,601 B2 | 3/2017 | Krause et al. |
| 9,614,589 B1 | 4/2017 | Russo et al. |
| 9,632,045 B2 | 4/2017 | Englund et al. |
| 9,645,223 B2 | 5/2017 | Megdal et al. |
| 9,680,338 B2 | 6/2017 | Malpas et al. |
| 9,689,679 B2 | 6/2017 | Budker et al. |
| 9,720,055 B1 | 8/2017 | Hahn et al. |
| 9,778,329 B2 | 10/2017 | Heidmann |
| 9,779,769 B2 | 10/2017 | Heidmann |
| 9,891,297 B2 | 2/2018 | Sushkov et al. |
| 2002/0144093 A1 | 10/2002 | Inoue et al. |
| 2002/0167306 A1 | 11/2002 | Zalunardo et al. |
| 2003/0058346 A1 | 3/2003 | Bechtel et al. |
| 2003/0076229 A1 | 4/2003 | Blanpain et al. |
| 2003/0094942 A1 | 5/2003 | Friend et al. |
| 2003/0098455 A1 | 5/2003 | Amin et al. |
| 2003/0235136 A1 | 12/2003 | Akselrod et al. |
| 2004/0013180 A1 | 1/2004 | Giannakis et al. |
| 2004/0022179 A1 | 2/2004 | Giannakis et al. |
| 2004/0042150 A1 | 3/2004 | Swinbanks et al. |
| 2004/0081033 A1 | 4/2004 | Arieli et al. |
| 2004/0095133 A1 | 5/2004 | Nikitin et al. |
| 2004/0109328 A1 | 6/2004 | Dahl et al. |
| 2004/0247145 A1 | 12/2004 | Luo et al. |
| 2005/0031840 A1 | 2/2005 | Swift et al. |
| 2005/0068249 A1 | 3/2005 | Frederick Du Toit et al. |
| 2005/0099177 A1 | 5/2005 | Greelish |
| 2005/0112594 A1 | 5/2005 | Grossman |
| 2005/0126905 A1 | 6/2005 | Golovchenko et al. |
| 2005/0130601 A1 | 6/2005 | Palermo et al. |
| 2005/0134257 A1 | 6/2005 | Etherington et al. |
| 2005/0138330 A1 | 6/2005 | Owens et al. |
| 2005/0146327 A1 | 7/2005 | Jakab |
| 2006/0012385 A1 | 1/2006 | Tsao et al. |
| 2006/0048640 A1 | 3/2006 | Terry et al. |
| 2006/0054789 A1 | 3/2006 | Miyamoto et al. |
| 2006/0055584 A1 | 3/2006 | Waite et al. |
| 2006/0062084 A1 | 3/2006 | Drew |
| 2006/0071709 A1 | 4/2006 | Maloberti et al. |
| 2006/0245078 A1 | 11/2006 | Kawamura |
| 2006/0247847 A1 | 11/2006 | Carter et al. |
| 2006/0255801 A1 | 11/2006 | Ikeda |
| 2006/0291771 A1 | 12/2006 | Braunisch et al. |
| 2007/0004371 A1 | 1/2007 | Okanobu |
| 2007/0120563 A1 | 5/2007 | Kawabata et al. |
| 2007/0247147 A1 | 10/2007 | Xiang et al. |
| 2007/0273877 A1 | 11/2007 | Kawano et al. |
| 2008/0016677 A1 | 1/2008 | Creighton, IV |
| 2008/0048640 A1 | 2/2008 | Hull et al. |
| 2008/0078233 A1 | 4/2008 | Larson et al. |
| 2008/0089367 A1 | 4/2008 | Srinivasan et al. |
| 2008/0204004 A1 | 8/2008 | Anderson |
| 2008/0217516 A1 | 9/2008 | Suzuki et al. |
| 2008/0239265 A1 | 10/2008 | Den Boef |
| 2008/0253264 A1 | 10/2008 | Nagatomi et al. |
| 2008/0265895 A1 | 10/2008 | Strack et al. |
| 2008/0266050 A1 | 10/2008 | Crouse et al. |
| 2008/0279047 A1 | 11/2008 | An et al. |
| 2008/0299904 A1 | 12/2008 | Yi et al. |
| 2009/0001979 A1 | 1/2009 | Kawabata |
| 2009/0015262 A1 | 1/2009 | Strack et al. |
| 2009/0042592 A1 | 2/2009 | Cho et al. |
| 2009/0058697 A1 | 3/2009 | Aas et al. |
| 2009/0060790 A1 | 3/2009 | Okaguchi et al. |
| 2009/0079417 A1 | 3/2009 | Mort et al. |
| 2009/0079426 A1 | 3/2009 | Anderson |
| 2009/0132100 A1 | 5/2009 | Shibata |
| 2009/0157331 A1 | 6/2009 | Van Netten |
| 2009/0161264 A1 | 6/2009 | Meyersweissflog |
| 2009/0195244 A1 | 8/2009 | Mouget et al. |
| 2009/0222208 A1 | 9/2009 | Speck |
| 2009/0243616 A1 | 10/2009 | Loehken et al. |
| 2009/0244857 A1 | 10/2009 | Tanaka |
| 2009/0277702 A1 | 11/2009 | Kanada et al. |
| 2009/0310650 A1 | 12/2009 | Chester et al. |
| 2010/0004802 A1 | 1/2010 | Bodin et al. |
| 2010/0015438 A1 | 1/2010 | Williams et al. |
| 2010/0015918 A1 | 1/2010 | Liu et al. |
| 2010/0045269 A1 | 2/2010 | Lafranchise et al. |
| 2010/0071904 A1 | 3/2010 | Burns et al. |
| 2010/0102809 A1 | 4/2010 | May |
| 2010/0102820 A1 | 4/2010 | Martinez et al. |
| 2010/0134922 A1 | 6/2010 | Yamada et al. |
| 2010/0157305 A1 | 6/2010 | Henderson |
| 2010/0188081 A1 | 7/2010 | Lammegger |
| 2010/0192532 A1 | 8/2010 | Slater et al. |
| 2010/0237149 A1 | 9/2010 | Olmstead |
| 2010/0271016 A1 | 10/2010 | Barclay et al. |
| 2010/0271032 A1 | 10/2010 | Helwig |
| 2010/0277121 A1 | 11/2010 | Hall et al. |
| 2010/0308813 A1 | 12/2010 | Lukin et al. |
| 2010/0321117 A1 | 12/2010 | Gan |
| 2010/0326042 A1 | 12/2010 | McLean et al. |
| 2011/0031969 A1 | 2/2011 | Kitching et al. |
| 2011/0034393 A1 | 2/2011 | Justen et al. |
| 2011/0059704 A1 | 3/2011 | Norimatsu et al. |
| 2011/0062957 A1 | 3/2011 | Fu et al. |
| 2011/0062967 A1 | 3/2011 | Mohaupt |
| 2011/0063957 A1 | 3/2011 | Isshiki et al. |
| 2011/0066379 A1 | 3/2011 | Mes |
| 2011/0120890 A1 | 5/2011 | MacPherson et al. |
| 2011/0127999 A1 | 6/2011 | Lott et al. |
| 2011/0153339 A1 | 6/2011 | Buck et al. |
| 2011/0165862 A1 | 7/2011 | Yu et al. |
| 2011/0175604 A1 | 7/2011 | Polzer et al. |
| 2011/0176563 A1 | 7/2011 | Friel et al. |
| 2011/0243267 A1 | 10/2011 | Won et al. |
| 2011/0270078 A1 | 11/2011 | Wagenaar et al. |
| 2011/0279120 A1 | 11/2011 | Sudow et al. |
| 2011/0315988 A1 | 12/2011 | Yu et al. |
| 2012/0016538 A1 | 1/2012 | Waite et al. |
| 2012/0019242 A1 | 1/2012 | Hollenberg et al. |
| 2012/0037803 A1 | 2/2012 | Strickland |
| 2012/0044014 A1 | 2/2012 | Stratakos et al. |
| 2012/0051996 A1 | 3/2012 | Scarsbrook et al. |
| 2012/0063505 A1 | 3/2012 | Okamura et al. |
| 2012/0087449 A1 | 4/2012 | Ling et al. |
| 2012/0089299 A1 | 4/2012 | Breed |
| 2012/0140219 A1 | 6/2012 | Cleary |
| 2012/0181020 A1 | 7/2012 | Barron et al. |
| 2012/0194068 A1 | 8/2012 | Cheng et al. |
| 2012/0203086 A1 | 8/2012 | Rorabaugh et al. |
| 2012/0232838 A1 | 9/2012 | Kemppi et al. |
| 2012/0235633 A1 | 9/2012 | Kesler et al. |
| 2012/0235634 A1 | 9/2012 | Hall et al. |
| 2012/0245885 A1 | 9/2012 | Kimishima |
| 2012/0257683 A1 | 10/2012 | Schwager et al. |
| 2012/0281843 A1 | 11/2012 | Christensen et al. |
| 2012/0326793 A1 | 12/2012 | Gan |
| 2013/0043863 A1 | 2/2013 | Ausserlechner et al. |
| 2013/0070252 A1 | 3/2013 | Feth |
| 2013/0093424 A1 | 4/2013 | Blank et al. |
| 2013/0107253 A1 | 5/2013 | Santori |
| 2013/0127518 A1 | 5/2013 | Nakao |
| 2013/0179074 A1 | 7/2013 | Haverinen |
| 2013/0215712 A1 | 8/2013 | Geiser et al. |
| 2013/0223805 A1 | 8/2013 | Ouyang et al. |
| 2013/0265042 A1 | 10/2013 | Kawabata et al. |
| 2013/0265782 A1 | 10/2013 | Barrena et al. |
| 2013/0270991 A1 | 10/2013 | Twitchen et al. |
| 2013/0279319 A1 | 10/2013 | Matozaki et al. |
| 2013/0292472 A1 | 11/2013 | Guha |
| 2014/0012505 A1 | 1/2014 | Smith et al. |
| 2014/0015522 A1 | 1/2014 | Widmer et al. |
| 2014/0037932 A1 | 2/2014 | Twitchen et al. |
| 2014/0044208 A1 | 2/2014 | Woodsum |
| 2014/0061510 A1 | 3/2014 | Twitchen et al. |
| 2014/0070622 A1 | 3/2014 | Keeling et al. |
| 2014/0072008 A1 | 3/2014 | Faraon et al. |
| 2014/0077231 A1 | 3/2014 | Twitchen et al. |

(56) References Cited

U.S. PATENT DOCUMENTS

| | | |
|---|---|---|
| 2014/0081592 A1 | 3/2014 | Bellusci et al. |
| 2014/0104008 A1 | 4/2014 | Gan |
| 2014/0126334 A1 | 5/2014 | Megdal et al. |
| 2014/0139322 A1 | 5/2014 | Wang et al. |
| 2014/0153363 A1 | 6/2014 | Juhasz et al. |
| 2014/0154792 A1 | 6/2014 | Moynihan et al. |
| 2014/0159652 A1 | 6/2014 | Hall et al. |
| 2014/0166904 A1 | 6/2014 | Walsworth et al. |
| 2014/0167759 A1 | 6/2014 | Pines et al. |
| 2014/0168174 A1 | 6/2014 | Idzik et al. |
| 2014/0180627 A1 | 6/2014 | Naguib et al. |
| 2014/0191139 A1 | 7/2014 | Englund |
| 2014/0191752 A1 | 7/2014 | Walsworth et al. |
| 2014/0197831 A1 | 7/2014 | Walsworth |
| 2014/0198463 A1 | 7/2014 | Klein |
| 2014/0210473 A1 | 7/2014 | Campbell et al. |
| 2014/0215985 A1 | 8/2014 | Pollklas |
| 2014/0225606 A1 | 8/2014 | Endo et al. |
| 2014/0247094 A1 | 9/2014 | Englund et al. |
| 2014/0264723 A1 | 9/2014 | Liang et al. |
| 2014/0265555 A1 | 9/2014 | Hall et al. |
| 2014/0272119 A1 | 9/2014 | Kushalappa et al. |
| 2014/0273826 A1 | 9/2014 | Want et al. |
| 2014/0291490 A1 | 10/2014 | Hanson et al. |
| 2014/0297067 A1 | 10/2014 | Malay |
| 2014/0306707 A1 | 10/2014 | Walsworth et al. |
| 2014/0327439 A1 | 11/2014 | Cappellaro et al. |
| 2014/0335339 A1 | 11/2014 | Dhillon et al. |
| 2014/0340085 A1 | 11/2014 | Cappellaro et al. |
| 2014/0368191 A1 | 12/2014 | Goroshevskiy et al. |
| 2015/0001422 A1 | 1/2015 | Englund et al. |
| 2015/0009003 A1 | 1/2015 | Ozawa et al. |
| 2015/0009746 A1 | 1/2015 | Kucsko et al. |
| 2015/0015247 A1 | 1/2015 | Goodwill et al. |
| 2015/0018018 A1 | 1/2015 | Shen et al. |
| 2015/0022404 A1 | 1/2015 | Chen et al. |
| 2015/0048822 A1 | 2/2015 | Walsworth et al. |
| 2015/0054355 A1 | 2/2015 | Ben-Shalom et al. |
| 2015/0061590 A1 | 3/2015 | Widmer et al. |
| 2015/0061670 A1 | 3/2015 | Fordham et al. |
| 2015/0090033 A1 | 4/2015 | Budker et al. |
| 2015/0128431 A1 | 5/2015 | Kuo |
| 2015/0137793 A1 | 5/2015 | Englund et al. |
| 2015/0153151 A1 | 6/2015 | Kochanski |
| 2015/0192532 A1 | 7/2015 | Clevenson et al. |
| 2015/0192596 A1 | 7/2015 | Englund et al. |
| 2015/0225052 A1 | 8/2015 | Cordell |
| 2015/0235661 A1 | 8/2015 | Heidmann |
| 2015/0236551 A1 | 8/2015 | Shearer et al. |
| 2015/0253355 A1 | 9/2015 | Grinolds et al. |
| 2015/0268373 A1 | 9/2015 | Meyer |
| 2015/0269957 A1 | 9/2015 | El Hallak et al. |
| 2015/0276897 A1 | 10/2015 | Leussler et al. |
| 2015/0288352 A1 | 10/2015 | Krause et al. |
| 2015/0299894 A1 | 10/2015 | Markham et al. |
| 2015/0303333 A1 | 10/2015 | Yu et al. |
| 2015/0314870 A1 | 11/2015 | Davies |
| 2015/0326030 A1 | 11/2015 | Malpas et al. |
| 2015/0326410 A1 | 11/2015 | Krause et al. |
| 2015/0354985 A1 | 12/2015 | Judkins et al. |
| 2015/0358026 A1 | 12/2015 | Gan |
| 2015/0374250 A1 | 12/2015 | Hatano et al. |
| 2015/0377865 A1 | 12/2015 | Acosta et al. |
| 2015/0377987 A1 | 12/2015 | Menon et al. |
| 2016/0018269 A1 | 1/2016 | Maurer et al. |
| 2016/0031339 A1 | 2/2016 | Geo |
| 2016/0036529 A1 | 2/2016 | Griffith et al. |
| 2016/0052789 A1 | 2/2016 | Gaathon et al. |
| 2016/0054402 A1 | 2/2016 | Meriles |
| 2016/0061914 A1 | 3/2016 | Jelezko |
| 2016/0071532 A9 | 3/2016 | Heidmann |
| 2016/0077167 A1 | 3/2016 | Heidmann |
| 2016/0097702 A1 | 4/2016 | Zhao et al. |
| 2016/0113507 A1 | 4/2016 | Reza et al. |
| 2016/0131723 A1 | 5/2016 | Nagasaka |
| 2016/0139048 A1 | 5/2016 | Heidmann |
| 2016/0146904 A1 | 5/2016 | Stetson, Jr. et al. |
| 2016/0161429 A1 | 6/2016 | Englund et al. |
| 2016/0161583 A1 | 6/2016 | Meriles et al. |
| 2016/0174867 A1 | 6/2016 | Hatano |
| 2016/0214714 A1 | 7/2016 | Sekelsky |
| 2016/0216304 A1 | 7/2016 | Sekelsky |
| 2016/0216340 A1 | 7/2016 | Egan et al. |
| 2016/0216341 A1 | 7/2016 | Boesch et al. |
| 2016/0221441 A1 | 8/2016 | Hall et al. |
| 2016/0223621 A1 | 8/2016 | Kaup et al. |
| 2016/0231394 A1 | 8/2016 | Manickam et al. |
| 2016/0266220 A1 | 9/2016 | Sushkov et al. |
| 2016/0282427 A1 | 9/2016 | Heidmann |
| 2016/0291191 A1 | 10/2016 | Fukushima et al. |
| 2016/0313408 A1 | 10/2016 | Hatano et al. |
| 2016/0348277 A1 | 12/2016 | Markham et al. |
| 2016/0356863 A1 | 12/2016 | Boesch et al. |
| 2017/0010214 A1 | 1/2017 | Osawa et al. |
| 2017/0010334 A1 | 1/2017 | Krause et al. |
| 2017/0010338 A1 | 1/2017 | Bayat et al. |
| 2017/0010594 A1 | 1/2017 | Kottapalli et al. |
| 2017/0023487 A1 | 1/2017 | Boesch |
| 2017/0030982 A1 | 2/2017 | Jeske et al. |
| 2017/0038314 A1 | 2/2017 | Suyama et al. |
| 2017/0038411 A1 | 2/2017 | Yacobi et al. |
| 2017/0068012 A1 | 3/2017 | Fisk |
| 2017/0074660 A1 | 3/2017 | Gann et al. |
| 2017/0075020 A1 | 3/2017 | Gann et al. |
| 2017/0075205 A1 | 3/2017 | Kriman et al. |
| 2017/0077665 A1 | 3/2017 | Liu et al. |
| 2017/0104426 A1 | 4/2017 | Mills |
| 2017/0138735 A1 | 5/2017 | Cappellaro et al. |
| 2017/0139017 A1 | 5/2017 | Egan et al. |
| 2017/0146615 A1 | 5/2017 | Wolf et al. |
| 2017/0199156 A1 | 7/2017 | Villani et al. |
| 2017/0205526 A1 | 7/2017 | Meyer |
| 2017/0207823 A1 | 7/2017 | Russo et al. |
| 2017/0211947 A1 | 7/2017 | Fisk |
| 2017/0212046 A1 | 7/2017 | Cammerata |
| 2017/0212177 A1 | 7/2017 | Coar et al. |
| 2017/0212178 A1 | 7/2017 | Hahn et al. |
| 2017/0212179 A1 | 7/2017 | Hahn et al. |
| 2017/0212180 A1 | 7/2017 | Hahn et al. |
| 2017/0212181 A1 | 7/2017 | Coar et al. |
| 2017/0212182 A1 | 7/2017 | Hahn et al. |
| 2017/0212183 A1 | 7/2017 | Egan et al. |
| 2017/0212184 A1 | 7/2017 | Coar et al. |
| 2017/0212185 A1 | 7/2017 | Hahn et al. |
| 2017/0212186 A1 | 7/2017 | Hahn et al. |
| 2017/0212187 A1 | 7/2017 | Hahn et al. |
| 2017/0212190 A1 | 7/2017 | Reynolds et al. |
| 2017/0212258 A1 | 7/2017 | Fisk |
| 2017/0261629 A1 | 9/2017 | Gunnarsson et al. |
| 2017/0343617 A1 | 11/2017 | Manickam et al. |
| 2017/0343619 A1 | 11/2017 | Manickam et al. |
| 2017/0343621 A1 | 11/2017 | Hahn et al. |
| 2017/0343695 A1 | 11/2017 | Stetson et al. |
| 2018/0136291 A1 | 5/2018 | Pham et al. |
| 2018/0275209 A1 | 9/2018 | Mandeville et al. |
| 2018/0275212 A1 | 9/2018 | Hahn et al. |

FOREIGN PATENT DOCUMENTS

| | | |
|---|---|---|
| DE | 69608006 T2 | 2/2001 |
| DE | 19600241 C2 | 8/2002 |
| DE | 10228536 A1 | 1/2003 |
| EP | 0 161 940 B1 | 12/1990 |
| EP | 0 718 642 | 6/1996 |
| EP | 0 726 458 | 8/1996 |
| EP | 1 505 627 | 2/2005 |
| EP | 1 685 597 | 8/2006 |
| EP | 1 990 313 | 11/2008 |
| EP | 2 163 392 | 3/2010 |
| EP | 2 495 166 A1 | 9/2012 |
| EP | 2 587 232 A1 | 5/2013 |
| EP | 2 705 179 | 3/2014 |
| EP | 2 707 523 | 3/2014 |
| EP | 2 745 360 | 6/2014 |

(56) References Cited

FOREIGN PATENT DOCUMENTS

| | | |
|---|---|---|
| EP | 2 769 417 | 8/2014 |
| EP | 2 790 031 | 10/2014 |
| EP | 2 837 930 | 2/2015 |
| EP | 2 907 792 | 8/2015 |
| GB | 2 423 366 A | 8/2006 |
| GB | 2 433 737 | 7/2007 |
| GB | 2 482 596 | 2/2012 |
| GB | 2 483 767 | 3/2012 |
| GB | 2 486 794 | 6/2012 |
| GB | 2 490 589 | 11/2012 |
| GB | 2 491 936 | 12/2012 |
| GB | 2 493 236 | 1/2013 |
| GB | 2 495 632 A | 4/2013 |
| GB | 2 497 660 | 6/2013 |
| GB | 2 510 053 A | 7/2014 |
| GB | 2 515 226 | 12/2014 |
| GB | 2 522 309 | 7/2015 |
| GB | 2 526 639 | 12/2015 |
| JP | 3782147 B2 | 6/2006 |
| JP | 4800896 B2 | 10/2011 |
| JP | 2012-103171 | 5/2012 |
| JP | 2012-110489 | 6/2012 |
| JP | 2012-121748 | 6/2012 |
| JP | 2013-028497 | 2/2013 |
| JP | 5476206 B2 | 4/2014 |
| JP | 5522606 B2 | 6/2014 |
| JP | 5536056 B2 | 7/2014 |
| JP | 5601183 B2 | 10/2014 |
| JP | 2014-215985 | 11/2014 |
| JP | 2014-216596 | 11/2014 |
| JP | 2015-518562 A | 7/2015 |
| JP | 5764059 B2 | 8/2015 |
| JP | 2015-167176 | 9/2015 |
| JP | 2015-529328 | 10/2015 |
| JP | 5828036 B2 | 12/2015 |
| JP | 5831947 B2 | 12/2015 |
| WO | WO-87/04028 A1 | 7/1987 |
| WO | WO-88/04032 A1 | 6/1988 |
| WO | WO-95/33972 A1 | 12/1995 |
| WO | WO-2009/073736 | 6/2009 |
| WO | WO-2011/046403 A2 | 4/2011 |
| WO | WO-2011/153339 | 12/2011 |
| WO | WO-2012/016977 A2 | 2/2012 |
| WO | WO-2012/084750 | 6/2012 |
| WO | WO-2013/027074 | 2/2013 |
| WO | WO-2013/059404 A1 | 4/2013 |
| WO | WO-2013/066446 A1 | 5/2013 |
| WO | WO-2013/066448 | 5/2013 |
| WO | WO-2013/093136 A1 | 6/2013 |
| WO | WO-2013/188732 A1 | 12/2013 |
| WO | WO-2013/190329 A1 | 12/2013 |
| WO | WO-2014/011286 A2 | 1/2014 |
| WO | WO-2014/099110 A2 | 6/2014 |
| WO | WO-2014/135544 A1 | 9/2014 |
| WO | WO-2014/135547 A1 | 9/2014 |
| WO | WO-2014/166883 A1 | 10/2014 |
| WO | WO-2014/210486 A1 | 12/2014 |
| WO | WO-2015/015172 A1 | 2/2015 |
| WO | WO-2015/142945 | 9/2015 |
| WO | WO-2015/157110 A1 | 10/2015 |
| WO | WO-2015/157290 A1 | 10/2015 |
| WO | WO-2015/158383 | 10/2015 |
| WO | WO-2015/193156 A1 | 12/2015 |
| WO | WO-2016/075226 A1 | 5/2016 |
| WO | WO-2016/118756 A1 | 7/2016 |
| WO | WO-2016/118791 A1 | 7/2016 |
| WO | WO-2016/122965 A1 | 8/2016 |
| WO | WO-2016/122966 A1 | 8/2016 |
| WO | WO-2016/126435 A1 | 8/2016 |
| WO | WO-2016/126436 A1 | 8/2016 |
| WO | WO-2016/190909 A2 | 12/2016 |
| WO | WO-2017/007513 A1 | 1/2017 |
| WO | WO-2017/007514 A1 | 1/2017 |
| WO | WO-2017/014807 A1 | 1/2017 |
| WO | WO-2017/039747 A1 | 3/2017 |
| WO | WO-2017/095454 A1 | 6/2017 |
| WO | WO-2017/127079 A1 | 7/2017 |
| WO | WO-2017/127080 A1 | 7/2017 |
| WO | WO-2017/127081 A1 | 7/2017 |
| WO | WO-2017/127085 A1 | 7/2017 |
| WO | WO-2017/127090 A1 | 7/2017 |
| WO | WO-2017/127091 A1 | 7/2017 |
| WO | WO-2017/127093 A1 | 7/2017 |
| WO | WO-2017/127094 A1 | 7/2017 |
| WO | WO-2017/127095 A1 | 7/2017 |
| WO | WO-2017/127096 A1 | 7/2017 |
| WO | WO-2017/127097 A1 | 7/2017 |
| WO | WO-2017/127098 A1 | 7/2017 |

OTHER PUBLICATIONS

U.S. Notice of Allowance dated Oct. 23, 2017, from related U.S. Appl. No. 15/003,797, 6 pages.
U.S. Office Action dated Nov. 24, 2017, from related U.S. Appl. No. 15/003,145, 14 pages.
U.S. Office Action dated Nov. 27, 2017, from related U.S. Appl. No. 15/468,386, 28 pages.
International Search Report and Written Opinion from related PCT application PCT/US2017/035315 dated Aug. 24, 2017, 7 pages.
Ramsey, et al., "Phase Shifts in the Molecular Beam Method of Separated Oscillating Fields", Physical Review, vol. 84, No. 3, Nov. 1, 1951, pp. 506-507.
U.S. Notice of Allowance on U.S. Appl. No. 14/676,740 dated Sep. 1, 2017, 7 pages.
U.S. Notice of Allowance on U.S. Appl. No. 15/003,206 dated Sep. 18, 2017, 11 pages.
U.S. Notice of Allowance on U.S. Appl. No. 15/003,281 dated Sep. 26, 2017, 7 pages.
U.S. Notice of Allowance on U.S. Appl. No. 15/476,636 dated Sep. 14, 2017, 10 pages.
U.S. Office Action on U.S. Appl. No. 15/003,176 dated Sep. 27, 2017, 8 pages.
U.S. Office Action on U.S. Appl. No. 15/003,292 dated Sep. 8, 2017, 8 pages.
European Extended Search Report for Appl. Ser. No. 16743879.5 dated Sep. 11, 2018, 11 pages.
European Extended Search Report for Appl. Ser. No, 16800410.9 dated Oct. 12, 2018, 11 pages.
Niu, "Crack Detection of Power Line Based on Metal Magnetic Memory Non-destructive", Telkomnika Indonesian Journal of Electrical Engineering, vol. 12, No. 11, Nov. 1, 2014, pp. 7764-7771.
U.S. Final Office Action for U.S. Appl. No. 15/380,691 dated Sep. 21, 2018, 12 pages.
U.S. Final Office Action for U.S. Appl. No. 15/479,256 dated Sep. 10, 2018, 20 pages.
U.S. Non-Final Office Action for U.S. Appl. No. 15/443,422 dated Oct. 2, 2018, 16 pages.
U.S. Non-Final Office Action for U.S. Appl. No. 15/446,373 dated Oct. 1, 2018, 13 pages.
U.S. Non-Final Office Action for U.S. Appl. No. 15/454,162 dated Sep. 10, 2018, 13 pages.
U.S. Non-Final Office Action for U.S. Appl. No. 15/468,282 dated Oct. 10, 2018, 12 pages.
U.S. Non-Final Office Action for U.S. Appl. No. 15/372,201 dated Oct. 15, 2018, 12 pages.
U.S. Non-Final Office Action for U.S. Appl. No. 15/468,274 dated Oct. 26, 2018, 11 pages.
U.S. Notice of Allowance for U.S. Appl. No. 14/866,730 dated Aug. 15, 2018, 9 pages.
U.S. Notice of Allowance for U.S. Appl. No. 15/468,289 dated Oct. 17, 2018, 12 pages.
U.S. Notice of Allowance for U.S. Appl. No. 15/003,704 dated Nov. 2, 2018, 19 pages.
U.S. Office Action for U.S. Appl. No. 15/468,397 dated Sep. 13, 2018, 7 pages.
Brenneis, et al. "Ultrafast electronic readout of diamond nitrogen-vacancy centres coupled to graphene." Nature nanotechnology 10.2 (2015): 135-139.

(56) References Cited

OTHER PUBLICATIONS

Chavez, et al. "Detecting Arctic oil spills with NMR: a feasibility study." Near Surface Geophysics 13.4 (Feb. 2015): 409-416.
Dale, et al. "Medical applications of diamond magnetometry: commercial viability." arXiv preprint arXiv:1705.01994 (May 8, 2017), pp. 1-7.
Fologea, et al. "Detecting single stranded DNA with a solid state nanopore." Nano Letters 5.10 (Aug. 15, 2005): 1905-1909.
Gaebel, et al. "Room-temperature coherent coupling of single spins in diamond." Nature Physics 2.6 (May 28, 2006): 408-413.
GB Examination Report from United Kingdom application No. GB 1617438.5 dated Oct. 28, 2016.
GB Examination Report from United Kingdom application No. GB 1618202.4 dated Jan. 10, 2017.
Heerema, et al. "Graphene nanodevices for DNA sequencing." Nature nanotechnology 11.2 (Feb. 3, 2016): 127-136.
International Search Report and Written Opinion of the International Searching Authority dated Apr. 4, 2017 from related PCT application PCT/US16/68366, 9 pages.
International Search Report and Written Opinion of the International Searching Authority dated Feb. 15, 2017 from related PCT application PCT/US2016/014390, 20 pages.
International Search Report and Written Opinion of the International Searching Authority dated Jul. 16, 2015, from related PCT application PCT/US2015/24723, 8 pages.
International Search Report and Written Opinion of the International Searching Authority dated Jul. 6, 2015, from related PCT application PCT/US2015/021093, 9 pages.
International Search Report and Written Opinion of the International Searching Authority dated Jul. 8, 2015, from related PCT application PCT/US2015/024265, 11 pages.
International Search Report and Written Opinion of the International Searching Authority dated Jun. 1, 2017, from related PCT application PCT/US17/21811, 9 pages.
International Search Report and Written Opinion of the International Searching Authority dated Jun. 1, 2017, in related PCT application PCT/US17/22279, 20 pages.
International Search Report and Written Opinion of the International Searching Authority dated Jun. 15, 2017, from related PCT application PCT/US2017/024175, 10 pages.
International Search Report and Written Opinion of the International Searching Authority dated Jun. 9, 2017, from related patent application PCT/US2017/024181, 13 pages.
International Search Report and Written Opinion of the International Searching Authority dated Jun. 9, 2017, from related PCT application PCT/US2017/024179, 9 pages.
International Search Report and Written Opinion of the International Searching Authority dated Mar. 13, 2017 from related PCT application PCT/US2016/68320, 10 pages.
International Search Report and Written Opinion of the International Searching Authority dated Mar. 27, 2017 from related PCT application PCT/US16/68344, 16 pages.
International Search Report and Written Opinion of the International Searching Authority dated Mar. 31, 2017 from related PCT application PCT/US2016/066566, 11 pages.
International Search Report and Written Opinion of the International Searching Authority dated May 10, 2017 from related PCT application PCT/US17/19411, 8 pages.
International Search Report and Written Opinion of the International Searching Authority dated May 18, 2017 from related PCT application PCT/US2017/021593, 10 pages.
International Search Report and Written Opinion of the International Searching Authority dated May 19, 2017 from related PCT application PCT/US17/18099, 16 pages.
International Search Report and Written Opinion of the International Searching Authority dated May 3, 2017 from related PCT application PCT/US2017/018701, 8 pages.
International Search Report and Written Opinion of the International Searching Authority dated May 4, 2017 from related PCT application PCT/US2017/018709, 8 pages.
International Search Report and Written Opinion of the International Searching Authority dated May 8, 2017 from related PCT application PCT/US2017/17321, 17 pages.
International Search Report and Written Opinion of the International Searching Authority dated Jun. 15, 2017, from related PCT application PCT/US2017/024182, 21 pages.
International Search Report and Written Opinion of the International Searching Authority dated Jun. 22, 2017, in related PCT application PCT/US2017/024180, 10 pages.
International Search Report and Written Opinion of the International Searching Authority dated Jun. 5, 2017, from related PCT application PCT/US2017/024169 (11 pages).
International Search Report and Written Opinion of the International Searching Authority dated Jun. 5, 2017, from related PCT application PCT/US2017/024174, 8 pages.
International Search Report and Written Opinion of the International Searching Authority dated Jun. 5, 2017, in related PCT application PCT/US2017/024168 (7 pages).
International Search Report and Written Opinion of the International Searching Authority dated Jun. 6, 2017, from related PCT application PCT/US2017/024172 (9 pages).
International Search Report and Written Opinion of the International Searching Authority dated Jun. 6, 2017, from related PCT application US/2017/024165 (9 pages).
Keyser "Enhancing nanopore sensing with DNA nanotechnology." Nature nanotechnology 11.2 (Feb. 2016): 106-108.
Lindsay "The promises and challenges of solid-state sequencing." Nature nanotechnology 11.2 (Feb. 2016): 109-111.
Matlashov, et al. "SQUIDs for magnetic resonance imaging at ultra-low magnetic field." PIERS online 5.5 (2009): 466-470.
Matlashov, et al. "SQUIDs vs. induction coils for ultra-low field nuclear magnetic resonance: experimental and simulation comparison." IEEE Transactions on Applied Superconductivity 21.3 (Jan. 1, 2012): 465-468.
Michaelovich et al., "Polarization Dependencies of the Nitrogen-Vacancy Center." Undergraduate Project Report, Ben-Gurion University, Aug. 2015.
Moessle, et al. "SQUID-detected magnetic resonance imaging in microtesla fields." Annu. Rev. Biomed. Eng. 9 (May 23, 2008): 389-413.
Notice of Allowance dated Jun. 8, 2017, from related U.S. Appl. No. 15/351,862, 7 pages.
Pelliccione, et al., Two-dimensional nanoscale imaging of gadolinium spins via scanning probe relaxometry with a single spin in diamond, Phys. Rev. Applied 2.5, (Sep. 8, 2014): 054014 pp. 1-17.
Qiu et al., "Low-field NMR Measurement Procedure when SQUID Detection is Used," IEEE/CSC & ESAS European Superconductivity News Forum, No. 5, Jul. 2008.
Qiu, et al. "SQUID-detected NMR in Earth's magnetic field." Journal of Physics: Conference Series. vol. 97. No. 1. IOP Publishing, Mar. 2008, pp. 1-7.
Sheinker et al., "Localization in 3-D Using Beacons of Low Frequency Magnetic Field." IEEE Transactions on Instrumentation and Measurement 62(12): 3194-3201 (Dec. 2013), 8 pages.
Steinert et al., "Magnetic spin imaging under ambient conditions with sub-cellular resolution." Nature Comms 4:1607 (Mar. 19, 2013).
Sushkov, et al. "All-optical sensing of a single-molecule electron spin." Nano letters 14.11 (Nov. 7, 2013): 6443-6448.
Tetienne, et al. "Spin relaxometry of single nitrogen-vacancy defects in diamond nanocrystals for magnetic noise sensing." Physical Review B 87.23 (Apr. 3, 2013): 235436-1-235436-5.
U.S. Notice of Allowance dated Aug. 17, 2016, from related U.S. Appl. No. 15/003,718, 8 pages.
U.S. Notice of Allowance dated Dec. 13, 2016, from related U.S. Appl. No. 14/680,877, 8 pages.
U.S. Notice of Allowance dated Dec. 22, 2016, from related U.S. Appl. No. 14/659,498, 10 pages.
U.S. Notice of Allowance dated Feb. 14, 2017, from related U.S. Appl. No. 15/003,677, 8 pages.
U.S. Notice of Allowance dated Jun. 20, 2017, from related U.S. Appl. No. 15/204,675, 9 pages.

(56) References Cited

OTHER PUBLICATIONS

U.S. Notice of Allowance dated Jun. 28, 2017 from related U.S. Appl. No. 15/003,256, 10 pages.
U.S. Notice of Allowance dated Jun. 29, 2017 from related U.S. Appl. No. 15/351,862, 4 pages.
U.S. Notice of Allowance dated Mar. 15, 2017, from related U.S. Appl. No. 15/351,862, 6 pages.
U.S. Notice of Allowance dated May 26, 2017 from related U.S. Appl. No. 15/218,821, 7 pages.
U.S. Office Action dated Apr. 17, 2017, from related U.S. Appl. No. 15/003,558, 12 pages.
U.S. Office Action dated Feb. 10, 2017, from related U.S. Appl. No. 14/676,740, 20 pages.
U.S. Office Action dated Feb. 10, 2017, from related U.S. Appl. No. 15/003,088, 11 pages.
U.S. Office Action dated Feb. 16, 2017, from related U.S. Appl. No. 15/204,675, 7 pages.
U.S. Office Action dated Jun. 1, 2017, from related U.S. Appl. No. 15/003,797, 29 pages.
U.S. Office Action dated Jun. 1, 2017, from related U.S. Appl. No. 15/179,957, 29 pages.
U.S. Office Action dated Jun. 12, 2017, from related U.S. Appl. No. 15/003,256, 9 pages.
U.S. Office Action dated Jun. 12, 2017, from related U.S. Appl. No. 15/003,336, 14 pages.
U.S. Office Action dated Jun. 16, 2017, from related U.S. Appl. No. 15/003,678, 15 pages.
U.S. Office Action dated Jun. 2, 2017, from related U.S. Appl. No. 15/476,636, 10 pages.
U.S. Office Action dated Mar. 1, 2017, from related U.S. Appl. No. 15/003,634, 7 pages.
U.S. Office Action dated Mar. 16, 2017, from related U.S. Appl. No. 15/218,821, 7 pages.
U.S. Office Action dated May 22, 2017, from related U.S. Appl. No. 15/003,206, 12 pages.
Wells, et al. "Assessing graphene nanopores for sequencing DNA." Nano letters 12.8 (Jul. 10, 2012): 4117-4123.
Wroble, "Performance Analysis of Magnetic Indoor Local Positioning System." Western Michigan University Master's Theses, Paper 609 (Jun. 2015), 42 pages.
Wysocki et al., "Modified Walsh-Hadamard sequences for DS CDMA wireless systems." Int. J. Adaptive Control and Signal Processing 16(8): 589-602 (Oct. 2002; first published online Sep. 23, 2002), 25 pages.
U.S. Appl. No. 14/659,498, filed Mar. 16, 2015, U.S. Pat. No. 9,638,821.
PCT/US2015/021093, Mar. 17, 2015, WO2015142945.
U.S. Appl. No. 14/676,740, filed Apr. 1, 2015, 20150326410.
PCT/US2015/024265, Apr. 3, 2015, WO2015157110.
PCT/US2015/024723, Apr. 7, 2015, WO2015157290.
U.S. Appl. No. 14/680,877, filed Apr. 7, 2015, U.S. Pat. No. 9,590,601.
U.S. Appl. No. 14/866,730, filed Sep. 25, 2015, 20160146904.
U.S. Appl. No. 15/003,678, filed Jan. 21, 2016.
U.S. Appl. No. 15/003,281, filed Jan. 21, 2016.
U.S. Appl. No. 15/003,292, filed Jan. 21, 2016.
U.S. Appl. No. 15/003,298, filed Jan. 21, 2016, U.S. Pat. No. 9,551,763.
U.S. Appl. No. 15/003,309, filed Jan. 21, 2016.
U.S. Appl. No. 15/003,176, filed Jan. 21, 2016, 20170123015.
U.S. Appl. No. 15/003,145, filed Jan. 21, 2016.
U.S. Appl. No. 15/003,336, filed Jan. 21, 2016.
U.S. Appl. No. 15/003,558, filed Jan. 21, 2016, 20170146617.
U.S. Appl. No. 15/003,519, filed Jan. 21, 2016, 20170146616.
U.S. Appl. No. 15/003,677, filed Jan. 21, 2016, U.S. Pat. No. 9,614,589.
U.S. Appl. No. 15/003,256, filed Jan. 21, 2016.
U.S. Appl. No. 15/003,577, filed Jan. 21, 2016.
U.S. Appl. No. 15/003,704, filed Jan. 21, 2016, 20160231394.
U.S. Appl. No. 15/003,718, filed Jan. 21, 2016, U.S. Pat. No. 9,541,610.
U.S. Appl. No. 15/003,062, filed Jan. 21, 2016, 20170023487.
U.S. Appl. No. 15/003,652, filed Jan. 21, 2016, 20170010594.
U.S. Appl. No. 15/003,634, filed Jan. 21, 2016.
U.S. Appl. No. 15/003,670, filed Jan. 21, 2016.
U.S. Appl. No. 15/003,088, filed Jan. 21, 2016, 20160214714.
U.S. Appl. No. 15/003,797, filed Jan. 21, 2016, 20160216341.
U.S. Appl. No. 15/003,590, filed Jan. 21, 2016, U.S. Pat. No. 9,557,391.
U.S. Appl. No. 15/003,206, filed Jan. 21, 2016, 20170110015.
U.S. Appl. No. 15/003,193, filed Jan. 21, 2016, 20160216304.
U.S. Appl. No. 15/003,617, filed Jan. 21, 2016, 20170010334.
U.S. Appl. No. 15/003,396, filed Jan. 21, 2016, 20170068012.
U.S. Appl. No. 15/003,177, filed Jan. 21, 2016.
U.S. Appl. No. 15/003,209, filed Jan. 21, 2016.
PCT/US2016/014389, Jan. 21, 2016, WO2017078766.
PCT/US2016/014336, Jan. 21, 2016, WO2016118756.
PCT/US2016/014403, Jan. 21, 2016, WO2016118791.
PCT/US2016/014331, Jan. 21, 2016, WO2016126435.
PCT/US2016/014387, Jan. 21, 2016, WO2017014807.
PCT/US2016/014390, Jan. 21, 2016, WO2016190909.
PCT/US2016/014385, Jan. 21, 2016, WO2016122966.
PCT/US2016/014375, Jan. 21, 2016, WO2016122965.
PCT/US2016/014298, Jan. 21, 2016, WO2017007514.
PCT/US2016/014297, Jan. 21, 2016, WO2017007513.
PCT/US2016/014377, Jan. 21, 2016, WO2017039747.
PCT/US2016/014392, Jan. 21, 2016.
PCT/US2016/014395, Jan. 21, 2016.
PCT/US2016/014394, Jan. 21, 2016.
PCT/US2016/014386, Jan. 21, 2016.
PCT/US2016/014333, Jan. 21, 2016, WO2016126436.
PCT/US2016/014328, Jan. 21, 2016, WO2017087014.
PCT/US2016/014325, Jan. 21, 2016, WO2017087013.
PCT/US2016/014330, Jan. 21, 2016.
PCT/US2016/014388, Jan. 21, 2016, WO2017095454.
PCT/US2016/014380, Jan. 21, 2016.
PCT/US2016/014290, Jan. 21, 2016.
PCT/US2016/014363, Jan. 21, 2016.
PCT/US2016/014287, Jan. 21, 2016.
PCT/US2016/014291, Jan. 21, 2016.
PCT/US2016/014396, Jan. 21, 2016.
PCT/US2016/014384, Jan. 21, 2016.
PCT/US2016/014376, Jan. 21, 2016.
U.S. Appl. No. 15/179,957, filed Jun. 10, 2016, 20160356863.
U.S. Appl. No. 15/207,457, filed Jul. 11, 2016.
U.S. Appl. No. 15/218,821, filed Jul. 25, 2016.
U.S. Appl. No. 15/204,675, filed Jul. 7, 2016.
U.S. Appl. No. 15/350,303, filed Nov. 14, 2016.
U.S. Appl. No. 15/351,862, filed Nov. 15, 2016.
U.S. Appl. No. 15/372,201, filed Dec. 7, 2016.
U.S. Appl. No. 15/376,244, filed Dec. 12, 2016.
PCT/US2016/066566, Dec. 14, 2016.
U.S. Appl. No. 15/380,691, filed Dec. 15, 2016.
U.S. Appl. No. 15/382,045, filed Dec. 16, 2016.
U.S. Appl. No. 15/380,419, filed Dec. 15, 2016.
PCT/US2016/068320, Dec. 22, 2016.
PCT/US2016/068344, Dec. 22, 2016.
PCT/US2016/068366, Dec. 22, 2016.
U.S. Appl. No. 15/419,832, filed Jan. 30, 2017, 20170139017.
U.S. Appl. No. 15/400,794, filed Jan. 6, 2017, 20170115361.
U.S. Appl. No. 15/443,422, filed Feb. 27, 2017.
PCT/US2017/017321, Feb. 10, 2017.
PCT/US2017/018099, Feb. 16, 2017.
U.S. Appl. No. 15/437,222, filed Feb. 20, 2017, 20170120293.
U.S. Appl. No. 15/437,038, filed Feb. 20, 2017.
PCT/US2017/018709, Feb. 21, 2017.
PCT/US2017/018701, Feb. 21, 2017.
U.S. Appl. No. 15/440,194, filed Feb. 23, 2017.
PCT/US2017/019411, Feb. 24, 2017.
U.S. Appl. No. 15/446,373, filed Mar. 1, 2017.
U.S. Appl. No. 15/450,504, filed Mar. 6, 2017.
U.S. Appl. No. 15/454,162, filed Mar. 9, 2017.

(56) References Cited

OTHER PUBLICATIONS

PCT/US2017/021593, Mar. 9, 2017.
PCT/US2017/021811, Mar. 10, 2017.
U.S. Appl. No. 15/456,913, filed Mar. 13, 2017.
PCT/US2017/022118, Mar. 13, 2017.
PCT/US2017/022279, Mar. 14, 2017.
U.S. Appl. No. 15/468,356, filed Mar. 24, 2017.
U.S. Appl. No. 15/468,397, filed Mar. 24, 2017.
U.S. Appl. No. 15/468,386, filed Mar. 24, 2017.
U.S. Appl. No. 15/468,289, filed Mar. 24, 2017.
U.S. Appl. No. 15/468,641, filed Mar. 24, 2017.
U.S. Appl. No. 15/468,582, filed Mar. 24, 2017.
U.S. Appl. No. 15/468,410, filed Mar. 24, 2017.
U.S. Appl. No. 15/468,951, filed Mar. 24, 2017.
U.S. Appl. No. 15/468,559, filed Mar. 24, 2017.
U.S. Appl. No. 15/468,282, filed Mar. 24, 2017.
U.S. Appl. No. 15/468,314, filed Mar. 24, 2017.
U.S. Appl. No. 15/468,274, filed Mar. 24, 2017.
U.S. Appl. No. 15/468,303, filed Mar. 24, 2017.
U.S. Appl. No. 15/469,374, filed Mar. 24, 2017.
PCT/US2017/024165, Mar. 24, 2017.
PCT/US2017/024167, Mar. 24, 2017.
PCT/US2017/024168, Mar. 24, 2017.
PCT/US2017/024169, Mar. 24, 2017.
PCT/US2017/024171, Mar. 24, 2017.
PCT/US2017/024172, Mar. 24, 2017.
PCT/US2017/024173, Mar. 24, 2017.
PCT/US2017/024174, Mar. 24, 2017.
PCT/US2017/024175, Mar. 24, 2017.
PCT/US2017/024177, Mar. 24, 2017.
PCT/US2017/024179, Mar. 24, 2017.
PCT/US2017/024180, Mar. 24, 2017.
PCT/US2017/024181, Mar. 24, 2017.
PCT/US2017/024182, Mar. 24, 2017.
U.S. Appl. No. 15/476,636, filed Mar. 31, 2017.
U.S. Appl. No. 15/479,256, filed Apr. 4, 2017.
U.S. Appl. No. 15/610,526, filed May 31, 2017.
PCT/US2017/035315, May 31, 2017.
Correction: Nizovtsev & Kilin, "Optically Detected Magnetic Resonance Spectra of the 14NV-13C Spin Systems in Diamond: Analytical Theory and Experiment," Doklady of the National Academy of Sciences of Belarus, 2013.
Correction: Terblanche, et al., "13C spin-lattice relaxation in natural diamond: Zeeman relaxation at 4.7 T and 300 K due to fixed paramagnetic nitrogen defects," Solid State Nuclear Magnetic Resonance, Aug. 2001.
Correction: Tong, et al., "A hybrid-system approach for W state and cluster state generation," Optics Communication 310: 166-172 (2014).
Correction: Yang & Gu, "Novel calibration techniques for high pulsed-magnetic fields using luminescence caused by photo," Journal of Huazhong University of Science and Technology, Jun. 2007.
Correction: Zhang, et al., "Laser-polarization-dependent spontaneous emission of the zero phonon line from single nitrogen-vacancy center in diamond," Chinese Physics B, Apr. 2014.
Acosta et al., "Broadband magnetometry by infrared-absorption detection of nitrogen-vacancy ensembles in diamond," Appl. Phys. Letters 97: 174104 (2010).
Barry et al., "Optical magnetic detection of single-neuron action potentials using quantum defects in diamond," submitted to Quantum Physics on Feb. 2, 2016.
Constable, "Geomagnetic Spectrum, Temporal." In Encyclopedia of Geomagnetism and Paleomagnetism, 353-355. Springer: Dordrecht, Netherlands (2007).
International Search Report and Written Opinion dated Mar. 25, 2016, from related PCT application PCT/US2016/014389.
International Search Report and Written Opinion of the International Searching Authority dated Apr. 1, 2016 from related PCT application PCT/US2016/014384.
International Search Report and Written Opinion of the International Searching Authority dated Apr. 11, 2016 from related PCT application PCT/US2016/014376.
International Search Report and Written Opinion of the International Searching Authority dated Apr. 11, 2016 from related PCT application PCT/US2016/014388.
International Search Report and Written Opinion of the International Searching Authority dated Apr. 11, 2016 from related PCT application PCT/US2016/014395.
International Search Report and Written opinion of the International Searching Authority dated Jul. 12, 2016, from related PCT application PCT/US2016/014287.
International Search Report and Written Opinion of the International Searching Authority dated Jun. 10, 2016 from related PCT application PCT/US2016/014290.
International Search Report and Written Opinion of the International Searching Authority dated Jun. 2, 2016, from related PCT application PCT/US2016/014386.
International Search Report and Written Opinion of the International Searching Authority dated Jun. 2, 2016, from related PCT application PCT/US2016/014387.
International Search Report and Written Opinion of the International Searching Authority dated Jun. 6, 2016, from related PCT application PCT/US2016/014291.
International Search Report and Written Opinion of the International Searching Authority dated Jun. 9, 2016 from related PCT application PCT/US2016/014333.
International Search Report and Written Opinion of the International Searching Authority dated Mar. 24, 2016 from related PCT application PCT/US2016/014336.
International Search Report and Written Opinion of the International Searching Authority dated Mar. 24, 2016 from related PCT application PCT/US2016/014297.
International Search Report and Written Opinion of the International Searching Authority dated Mar. 24, 2016 from related PCT application PCT/US2016/014392.
International Search Report and Written Opinion of the International Searching Authority dated Mar. 24, 2016 from related PCT application PCT/US2016/014403.
International Search Report and Written Opinion of the International Searching Authority dated Mar. 25, 2016, from related PCT application PCT/US2016/014363.
International Search Report and Written Opinion of the International Searching Authority dated Mar. 28, 2016, from related PCT application PCT/US2016/014380.
International Search Report and Written Opinion of the International Searching Authority dated Mar. 28, 2016, from related PCT application PCT/US2016/014394.
International Search Report and Written Opinion of the International Searching Authority dated Mar. 29, 2016 from related PCT application PCT/US2016/014325.
International Search Report and Written Opinion of the International Searching Authority dated Mar. 29, 2016 from related PCT application PCT/US2016/014330.
International Search Report and Written Opinion of the International Searching Authority dated Mar. 29, 2016 from related PCT application PCT/US/2016014328.
International Search Report and Written Opinion of the International Searching Authority dated Mar. 29, 2016, from related PCT application PCT/US2016/014385.
International Search Report and Written Opinion of the International Searching Authority dated Mar. 30, 2016 from related PCT application PCT/US2016/014298.
International Search Report and Written Opinion of the International Searching Authority dated Mar. 31, 2016 from related PCT application PCT/US2016/014375.
International Search Report and Written Opinion of the International Searching Authority dated Mar. 31, 2016 from related PCT application PCT/US2016/014396.
International Search Report and Written Opinion of the International Searching Authority dated May 26, 2016, 2016 from related PCT application PCT/US2016/014331.

(56) References Cited

OTHER PUBLICATIONS

Le Sage et al., "Efficient photon detection from color centers in a diamond optical waveguide," Phys. Rev. B 85: 121202(R) (2012).
MacQuarie et al., "Mechanical spin control of nitrogen-vacancy centers in diamond," Retrieved from http://www.arxiv.org/pdf/1306.6356.pdf (Jun. 2013).
Nobauer et al., "Smooth optimal quantum control for robust solid state spin magnetometry," Retrieved from http://www.arxiv.org/abs/1412.5051 (Dec. 2014).
Polatomic. "AN/ASQ-233A Digital Magnetic Anomaly Detective Set." Retrieved May 9, 2016, from http://polatomic.com/images/DMAD_Data_Sheet_09-2009.pdf (2009).
Poole, "What is GMSK Modulation—Gaussian Minimum Shift Keying." Radio-Electronics. Apr. 3, 2015 (Apr. 2015), pp. 1 [online] https://web.archive.org/web/20150403045840/http://www.radio-electronics.com/info/rf-technology-design/pm-phase-modulation/what-is-gmsk-gaussian-minimum-shift-keyingtutorial.php.
Rondin et al., "Magnetometry with nitrogen-vacancy defects in diamond." May 22, 2014 (May 22, 2014), pp. 1 [online] http://arxiv.org/pdf/1311.5214.pdf.
Shao et al., "Diamond Color Center Based FM Microwave Demodulator," in Conference on Lasers and Electro-Optics, OSA Technical Digest (online) (Optical Society of America, 2016), paper JTh2A.136.
U.S. Notice of Allowance dated Apr. 20, 2016, on U.S. Appl. No. 15/003,718.
U.S. Notice of Allowance dated Mar. 29, 2016 in U.S. Appl. No. 15/003,590.
U.S. Notice of Allowance dated Jul. 19, 2016, from related U.S. Appl. No. 15/003,590.
U.S. Office Action dated May 13, 2016, from related U.S. Appl. No. 14/676,740.
U.S. Office Action dated May 6, 2016, from related U.S. Appl. No. 14/659,498.
Wahlstrom et al., "Modeling Magnetic Fields Using Gaussian Processes," 2013 IEEE International Conference on Acoustics, Speech, and Signal Processing, pp. 3522-3526 (May 26-31, 2013).
"'Diamond Sensors, Detectors, and Quantum Devices' in Patent Application Approval Process," Chemicals & Chemistry (Feb. 28, 2014).
"Findings from University of Stuttgart in physics reported," Physics Week (Jul. 7, 2009).
"New Findings on Nitrogen from Ecole Normale Superieure Summarized (Magnetic imaging with an ensemble of nitrogen vacancy-centers in diamond)," Physics Week (Jul. 21, 2015).
"Patent Issued for Diamond Sensors, Detectors, and Quantum Devices (USPTO U.S. Pat. No. 9,249,526)," Journal of Engineering (Feb. 15, 2016).
"Researchers Submit Patent Application, 'Diamond Sensors, Detectors, and Quantum Devices', for Approval," Chemicals & Chemistry (Apr. 11, 2014).
Baranov, et al., "Enormously High Concentrations of Fluorescent Nitrogen-Vacancy Centers Fabricated by Sintering of Detonation Nanodiamonds," Small, Jun. 2011.
Massachusetts Institute of Technology; "Wide-Field Imaging Using Nitrogen Vacancies" in Patent Application Approval Process, Physics Week (2015).
Maze et al., "Nanoscale magnetic sensing with an individual electronic spin in diamond," Nature Physics (2008).
Steinert et al., "High-sensitivity magnetic imaging using an array of spins in diamond," Rev. Sci. Inst. (2010).
Acosta, "Optical Magnetometry with Nitrogen-Vacancy Centers in Diamond," University of California Berkeley, 2011.
Acosta, et al., "Diamonds with a high density of nitrogen—vacancy centers for magnetometry applications," Physical Review B, Sep. 2009.
Acosta, et al., "Nitrogen-vacancy centers: physics and applications," MRS Bulletin, 2013.
Aiello, et al., "Composite-pulse magnetometry with a solid-state quantum sensor," Nature Communications, Jan. 2013.
Alam, "Solid-state C-13 magic angle spinning NMR spectroscopy characterization of particle size structural variations in synthetic nanodiamonds," Materials Chemistry and Physics, Jun. 2004.
Albrecht, et al., "Coupling of nitrogen vacancy centres in nanodiamonds by means of phonons," New Journal of Physics, Aug. 2013.
Anthony, et al., "Jahn-Teller Splitting and Zeeman Effect of Acceptors in Diamond," 20th International Conference on Defects in Semiconductors, Jul. 1999.
Appel, et al., "Nanoscale microwave imaging with a single electron spin in diamond," New Journal of Physics, Nov. 2015.
Arai, et al., "Fourier magnetic imaging with nanoscale resolution and compressed sensing speed-up using electronic spins in diamond," Nature Nanotechnology, Oct. 2015.
Aslam, et al., "Single spin optically detected magnetic resonance with 60-90 GHz (E-band) microwave resonators," Review of Scientific Instruments, Jun. 2015.
Awschalom, et al., "Diamond age of spintronics," Scientific American, Oct. 2007.
Babamoradi, et al., "Correlation between entanglement and spin density in nitrogen-vacancy center of diamond," European Physical Journal D, Dec. 2011.
Babunts, et al., "Diagnostics of NV defect structure orientation in diamond using optically detected magnetic resonance with a modulated magnetic field," Technical Physics Letters, Jun. 2015.
Babunts, et al., "Temperature-scanned magnetic resonance and the evidence of two-way transfer of a nitrogen nuclear spin hyperfine interaction in coupled NV-N pairs in diamond," JETP Letters, Jun. 2012.
Bagguley, et al., "Zeeman effect of acceptor states in semiconducting diamond," Journal of the Physical Society of Japan, 1966.
Balasubramanian, et al., "Nanoscale imaging magnetometry with diamond spins under ambient conditions," Nature, Oct. 2008.
Balmer, et al., "Chemical Vapour deposition synthetic diamond: materials technology and applications," J. of Physics, 2009.
Barfuss, et al., "Strong mechanical driving of a single electron spin," Nature Physics, Oct. 2015.
Bennett, et al., "CVD Diamond for High Power Laser Applications," Proceedings of SPIE, Jan. 2013.
Berman & Chernobrod, "Single-spin microscope with sub-nanoscale resolution based on optically detected magnetic resonance," Proceedings of SPIE, May 2010.
Berman, et al. "Measurement of single electron and nuclear spin states based on optically detected magnetic resonance," J. Physics: Conf. Series 38: 167-170 (2006).
Blakley, et al., "Room-temperature magnetic gradiometry with fiber-coupled nitrogen-vacancy centers in diamond," Optics Letters, Aug. 2015.
Bourgeois, et al., "Photoelectric detection of electron spin resonance of nitrogen-vacancy centres in diamond," Nature Communications, Oct. 2015.
Budker & Kimball, "Optical Magnetometry," Cambridge Press, 2013.
Budker & Romalis, "Optical Magnetometry," Nature Physics, 2007.
Casanova, et al., "Effect of magnetic field on phosphorus centre in diamond," Physica Status Solidi A, Jul. 2001.
Castelletto, et al., "Frontiers in diffraction unlimited optical methods for spin manipulation, magnetic field sensing and imaging using diamond nitrogen vacancy defects," Nanophotonics, 2012.
Chapman, et al., "Anomalous saturation effects due to optical spin depolarization in nitrogen-vacancy centers in diamond nanocrystals," Physical Review B, Jul. 2012.
Chen, et al., "Vector magnetic field sensing by a single nitrogen vacancy center in diamond," EPL, Mar. 2013.
Chernobrod, et al., "Improving the sensitivity of frequency modulation spectroscopy using nanomechanical cantilevers," Applied Physics Letters, 2004.
Chernobrod, et al., "Spin Microscope Based on Optically Detected Magnetic Resoncance," Journal of Applied Physics, 2005.
Childress, et al., "Coherent dynamics of coupled electron and nuclear spin qubits in diamond," Science, 2006.
Chipaux, et al., "Magnetic imaging with an ensemble of nitrogen vacancy-centers in diamond," European Physical Journal D, Jul. 2015.

(56) References Cited

OTHER PUBLICATIONS

Chipaux, et al., "Nitrogen vacancies (NV) centers in diamond for magnetic sensors and quantum sensing," Proceedings of SPIE, Jan. 2015.
Chipaux, et al., "Wide bandwidth instantaneous radio frequency spectrum analyzer based on nitrogen vacancy centers in diamond," Applied Physics Letters, Dec. 2015.
Clevenson, et al., "Broadband magnetometry and temperature sensing with a light-trapping diamond waveguide," Nature Physics, May 2015.
Cooper, et al., "Time-resolved magnetic sensing with electronic spins in diamond," Nature Communications, Jan. 2014.
Creedon, et al., "Strong coupling between P1 diamond impurity centers and a three-dimensional lumped photonic microwave cavity," Physical Review B, Apr. 2015.
Davies, "Current problems in diamond: towards a quantitative understanding," Physica B—Condensed Matter, Dec. 1999.
De Lange, et al., "Single-Spin Magnetometry with Multipulse Sensing Sequences," Physical Review Letters, Feb. 2011.
Degen, "Scanning magnetic field microscope with a diamond single-spin sensor," Applied Physics Letters, 2008.
Delacroix, et al., "Design, manufacturing, and performance analysis of mid-infrared achromatic half-wave plates with diamond subwavelength gratings," Applied Optics, 2012.
Denatale, et al., "Fabrication and characterization of diamond moth eye antireflective surfaces on Ge," J. of Applied Physics, 1982.
Dobrovitski, et al., "Quantum Control over Single Spins in Diamond," Annual Review of Condensed Matter Physics vol. 4, 2013.
Doherty, et al., "The nitrogen-vacancy colour centre in diamond," Physics Reports, Jul. 2013.
Doherty, et al., "Theory of the ground-state spin of the NV-center in diamond," Physical Review B, May 2012.
Doi, et al., "Pure negatively charged state of the NV center in n-type diamond," Physical Review B, Feb. 2016.
Drake, et al., "Influence of magnetic field alignment and defect concentration on nitrogen-vacancy polarization in diamond," New Journal of Physics, Jan. 2016.
Dreau, et al., "Avoiding power broadening in optically detected magnetic resonance of single NV defects for enhanced dc magnetic field sensitivity," Physical Review B, Nov. 2011.
Dreau, et al., "High-resolution spectroscopy of single NV defects coupled with nearby C-13 nuclear spins in diamond," Physical Review B, Apr. 2012.
Dumeige, et al., "Magnetometry with nitrogen-vacancy ensembles in diamond based on infrared absorption in a doubly resonant optical cavity," Physical Review B, Apr. 2013.
Epstein, et al., "Anisotropic interactions of a single spin and dark-spin spectroscopy in diamond," Center for Spintronics and Quantum Computation, 2005.
Fedotov, et al., "High-resolution magnetic field imaging with a nitrogen-vacancy diamond sensor integrated with a photonic-crystal fiber," Optics Letters, Feb. 2016.
Fedotov, et al., "Photonic-crystal-fiber-coupled photoluminescence interrogation of nitrogen vacancies in diamond nanoparticles," Laser Physics Letters, Feb. 2012.
Feng & Wei, "A steady-state spectral method to fit microwave absorptions of NV centers in diamonds: application to sensitive magnetic field sensing," Measurement Science & Technology, Oct. 2014.
Freitas, et al., "Solid-State Nuclear Magnetic Resonance (NMR) Methods Applied to the Study of Carbon Materials," Chemistry and Physics of Carbon, vol. 31, 2012.
Geiselmann, et al., "Fast optical modulation of the fluorescence from a single nitrogen-vacancy centre," Nature Physics, Dec. 2013.
Gombert & Blasi, "The Moth-Eye Effect—From Fundamentals to Commercial Exploitation," Functional Properties of Bio-Inspired Surfaces, Nov. 2009.
Gong, et al., "Generation of Nitrogen-Vacancy Center Pairs in Bulk Diamond by Molecular Nitrogen Implantation," Chinese Physics Letters, Feb. 2016.
Gould, et al., "An imaging magnetometer for bio-sensing based on nitrogen-vacancy centers in diamond," Proceedings of the SPIE—Progress in Biomedical Optics and Imaging, 2014.
Gould, et al., "Room-temperature detection of a single 19 nm super-paramagnetic nanoparticle with an imaging magnetometer," Applied Physics Letters, Aug. 2014.
Gruber, et al., "Scanning confocal optical microscopy and magnetic resonance on single defect centers," Science, Jun. 1997.
Haeberle, et al., "Nanoscale nuclear magnetic imaging with chemical contrast," Nature Nanotechnology, Feb. 2015.
Haihua, et al., "Design of wideband anti-reflective sub wavelength nanostructures," Infrared and Laser Engineering, 2011.
Hall, et al., "Sensing of Fluctuating Nanoscale Magnetic Fields Using Nitrogen-Vacancy Centers in Diamond," Physical Review Letters, Nov. 2009.
Hanson, et al., "Coherent Dynamics of a single spin interacting with an adjustable spin bath," Sci. Am. Ass'n for the Advancement of Science, 2008.
Hanson, et al., "Polarization and Readout of Coupled Single Spins in Diamond," Physical Review Letters, 2006.
Hanson, et al., "Room-temperature manipulation and decoherence of a single spin in diamond," Physical Review, 2006.
Hanzawa, et al., "Zeeman effect on the zero-phonon line of the NV center in synthetic diamond," Physica B, Feb. 1993.
Hegyi & Yablonovitch, "Molecular imaging by optically detected electron spin resonance of nitrogen-vacancies in nanodiamonds," Nano Letters, Mar. 2013.
Hegyi & Yablonovitch, "Nanodiamond molecular imaging with enhanced contrast and expanded field of view," Journal of Biomedical Optics, Jan. 2014.
Hilser, et al., "All-optical control of the spin state in the NV-center in diamond," Physical Review B, Sep. 2012.
Hobbs, "Study of the Environmental and Optical Durability of AR Microstructures in Sapphire, ALON, and Diamond," Proceedings of SPIE, 2009.
Huebener, et al., "ODMR of NV centers in nano-diamonds covered with N@C60," Physica Status Solidi B, Oct. 2008.
Huxter, et al., "Vibrational and electronic dynamics of nitrogen-vacancy centres in diamond revealed by two-dimensional ultrafast spectroscopy," Nature Physics, Nov. 2013.
Ivady, et al., "Pressure and temperature dependence of the zero-field splitting in the ground state of NV centers in diamond: A first-principles study," Physical Review B, Dec. 2014.
Jarmola, et al., "Temperature- and Magnetic-Field-Dependent Longitudinal Spin Relaxation in Nitrogen-Vacancy Ensembles in Diamond," Physical Review Letters, May 2012.
Jensen, et al., "Light narrowing of magnetic resonances in ensembles of nitrogen-vacancy centers in diamond," Physical Review, Jan. 2013.
Kailath, "Linear Systems," Prentice Hall, 1979.
Karlsson, et al., "Diamond micro-optics: microlenses and antireflection structures surfaces for the infrared spectral region," Optics Express, 2003.
Khan & Hemmer, "Noise limitation in nano-scale imaging," Proceedings of SPIE, Dec. 2005.
Kim, et al., "Electron spin resonance shift and linewidth broadening of nitrogen-vacancy centers in diamond as a function of electron irradiation dose," Applied Physics Letters, Aug. 2012.
Kim, et al., "Magnetospectroscopy of acceptors in 'blue' diamonds," Physica B, Aug. 2001.
Kim, et al., "Zeeman effect of electronic Raman lines of accepters in elemental semiconductors: Boron in blue diamond," Physical Review B, Sep. 2000.
King, et al., "Optical polarization of 13C nuclei in diamond through nitrogen vacancy centers," Physical Review B, Feb. 2010.
Kok, et al., "Materials Science: Qubits in the pink," Nature, 2006.
Konenko, et al., "Formation of antireflective surface structures on diamond films by laser patterning," Applied Physics A, 1999.
Kraus, et al., "Magnetic field and temperature sensing with atomic-scale spin defects in silicon carbide," Scientific Reports, Jul. 2014.
Lai, et al., "Influence of a static magnetic field on the photoluminescence of an ensemble of nitrogen-vacancy color centers in a diamond single-crystal," Applied Physics Letters, Sep. 2009.

(56) References Cited

OTHER PUBLICATIONS

Lai, et al., "Optically detected magnetic resonance of a single Nitrogen-Vacancy electronic spin in diamond nanocrystals," CLEO/EQEC, 2009.
Laraoui, et al., "Nitrogen-vacancy-assisted magnetometry of paramagnetic centers in an individual diamond nanocrystal," Nano Letters, Jul. 2012.
Lazariev, et al., "A nitrogen-vacancy spin based molecular structure microscope using multiplexed projection reconstruction," Scientific Reports, Sep. 2015.
Lee, et al., "Vector magnetometry based on S=3/2 electronic spins," Physical Review B, Sep. 2015.
Lesik, et al., "Preferential orientation of NV defects in CVD diamond films grown on (113)-oriented substrates," Diamond and Related Materials, Jun. 2015.
Levchenko, et al., "Inhomogeneous broadening of optically detected magnetic resonance of the ensembles of nitrogen-vacancy centers in diamond by interstitial carbon atoms," Applied Physics Letters, Mar. 2015.
Liu, et al., "Electron spin studies of nitrogen vacancy centers in nanodiamonds," Acta Physica Sinica, Aug. 2013.
Liu, et al., "Fiber-integrated diamond-based magnetometer," Applied Physics Letters, Sep. 2013.
MacLaurin, et al., "Nanoscale magnetometry through quantum control of nitrogen-vacancy centres in rotationally diffusing nanodiamonds," New Journal of Physics, Jan. 2013.
Macs, et al., "Diamond as a magnetic field calibration probe," Journal of Physics D: Applied Physics, Apr. 2004.
Maletinsky, et al., "A robust scanning diamond sensor for nanoscale imaging with single nitrogen-vacancy centres," Nature Nanotechnology, May 2012.
Mamin, et al., "Multipulse Double-Quantum Magnetometry with Near-Surface Nitrogen-Vacancy Centers," Physical Review Letters, Jul. 2014.
Mamin, et al., "Nanoscale Nuclear Magnetic Resonance with a Nitrogen-Vacancy Spin Sensor," Science, Feb. 2013.
Manson, et al., "GR transitions in diamond: magnetic field measurements," Journal of Physics C, Nov. 1980.
Matsuda, et al., "Development of a plastic diamond anvil cell for high pressure magneto-photoluminescence in pulsed high magnetic fields," International Journal of Modern Physics B, Nov. 2004.
Maze, et al., "Nanoscale magnetic sensing using spin qubits in diamond," Nature Physics, 2009.
Meijer, et al., "Generation of single color centers by focused nitrogen implantation," Applied Physics Letters, Dec. 2005.
Millot, et al., "High-field Zeeman and paschen-back effects at high pressure in oriented ruby," Physical Review B, Oct. 2008.
Moriyama, et al., "Importance of electron-electron interactions and Zeeman splitting in single-wall carbon nanotube quantum dots," Physica E, Feb. 2005.
Mrozek, et al., "Circularly polarized microwaves for magnetic resonance study in the GHz range: Application to nitrogen-vacancy in diamonds," Applied Physics Letters, Jul. 2015.
Nagl, et al., "Improving surface and defect center chemistry of fluorescent nanodiamonds for imaging purposes—a review," Analytical and Bioanalaytical Chemistry, Oct. 2015.
Neumann, et al., "Excited-state spectroscopy of single NV defects in diamond using optically detected magnetic resonance," New Journal of Physics, Jan. 2009.
Nizovtsev & Kilin, "Optically Detected Magnetic Resonance Spectra of the 14NV-13C Spin Systems in Diamond: Analytical Theory and Experiment," Doklady of the National Academy of Sciences of Belarus, 2013.
Nizovtsev, et al., "Modeling fluorescence of single nitrogen-vacancy defect centers in diamond," Physica B—Condensed Matter, Dec. 2001.
Nizovtsev, et al., "Theoretical study of hyperfine interactions and optically detected magnetic resonance spectra by simulation of the C-291(NV)H—(172) diamond cluster hosting nitrogen-vacancy center," New Journal of Physics, Aug. 2014.
Nowodzinski, et al., "Nitrogen-Vacancy centers in diamond for current imaging at the redistributive layer level of Integrated Circuits," Microelectronics Reliability, Aug. 2015.
Nusran, et al., "Optimizing phase-estimation algorithms for diamond spin magnetometry," Physical Review B, Jul. 2014.
Ohashi, et al., "Negatively Charged Nitrogen-Vacancy Centers in a 5 nm Thin C-12 Diamond Film," Nano Letters, Oct. 2013.
Plakhotnik, et al., "Super-Paramagnetic Particles Chemically Bound to Luminescent Diamond : Single Nanocrystals Probed with Optically Detected Magnetic Resonance," Journal of Physical Chemistry C, Aug. 2015.
Rabeau, et al., "Implantation of labelled single nitrogen vacancy centers in diamond using N-15," Applied Physics Letters, Jan. 2006.
Ranjbar, et al., "Many-electron states of nitrogen-vacancy centers in diamond and spin density calculations," Physical Review B, Oct. 2011.
Reynhardt, "Spin-lattice relaxation of spin-1/2 nuclei in solids containing diluted paramagnetic impurity centers. I. Zeeman polarization of nuclear spin system," Concepts in Magnetic Resonance Part A, Sep. 2003.
Rogers, et al., "Singlet levels of the NV(−)centre in diamond," New Journal of Physics, Jan. 2015.
Rondin, et al., "Magnetometry with nitrogen-vacancy defects in diamond," Reports on Progress in Physics, May 2014.
Rondin, et al., "Nanoscale magnetic field mapping with a single spin scanning probe magnetometer," Applied Physics Letters, Apr. 2012.
Sarkar, et al., "Magnetic properties of graphite oxide and reduced graphene oxide," Physica E, 2014.
Scheuer, et al., "Accelerated 2D magnetic resonance spectroscopy of single spins using matrix completion," Scientific Reports, Dec. 2015.
Schirhagl, et al., "Nitrogen-vacancy centers in diamond: Nanoscale sensors for physics and biology," Annual Review of Physical Chemistry, Jan. 2014.
Schoenfeld & Harneit, "Real time magnetic field sensing and imaging using a single spin in diamond," Physical Review Letters, Jan. 2011.
Sedov, et al., "Si-doped nano- and microcrystalline diamond films with controlled bright photoluminescence of silicon-vacancy color centers," Diamond and Related Materials, Jun. 2015.
Shames, et al., "Magnetic resonance tracking of fluorescent nanodiamond fabrication," Journal of Physics D: Applied Physics, Apr. 2015.
Simanovskaia, et al., "Sidebands in optically detected magnetic resonance signals of nitrogen vacancy centers in diamond," Physical Review B, Jun. 2013.
Sotoma, et al., "Effective production of fluorescent nanodiamonds containing negatively-charged nitrogen-vacancy centers by ion irradiation," Diamond and Related Materials, Oct. 2014.
Steiner, et al., "Universal enhancement of the optical readout fidelity of single electron spins at nitrogen-vacancy centers in diamond," Physical Review B, Jan. 2010.
Steinert, et al., "High sensitivity magnetic imaging using an array of spins in diamond," Review of Scientific Instruments, Apr. 2010.
Stepanov, et al., "High-frequency and high-field optically detected magnetic resonance of nitrogen-vacancy centers in diamond," Applied Physics Letters, Feb. 2015.
Sternschulte, et al., "Uniaxial stress and Zeeman splitting of the 1.681 eV optical center in a homoepitaxial CVD diamond film," Diamond and Related Materials, Sep. 1995.
Storteboom, et al., "Lifetime investigation of single nitrogen vacancy centres in nanodiamonds," Optics Express, May 2015.
Tahara, et al., "Quantifying selective alignment of ensemble nitrogen-vacancy centers in (111) diamond," Applied Physics Letters, Nov. 2015.
Taylor, et al., "High-sensitivity diamond magnetometer with nanoscale resolution," Nature Physics, Oct. 2008.
Terblanche, et al., "13C spin-lattice relaxation in natural diamond: Zeeman relaxation at 4.7 T and 300 K due to fixed paramagnetic nitrogen defects," Solid State Nuclear Magnetic Resonance, Aug. 2001.

(56) References Cited

OTHER PUBLICATIONS

Terblanche, et al., "13C spin-lattice relaxation in natural diamond: Zeeman relaxation in fields of 500 to 5000 G at 300 K due to fixed paramagnetic nitrogen defects," Solid State Nuclear Magnetic Resonance, May 2001.
Tetienne, et al., "Magnetic-field-dependent photodynamics of single NV defects in diamond: an application to qualitative all-optical magnetic imaging," New Journal of Physics, Oct. 2012.
Tong, et al., "A hybrid-system approach for W state and cluster state generation," Optics Communication 310: 166-172 (2014).
Uhlen, et al., "New Diamond Nanofabrication process for hard x-ray zone plates," J. of Vacuum Science & Tech. B, 2011.
Vershovskii & Dmitriev, "Combined excitation of an optically detected magnetic resonance in nitrogen-vacancy centers in diamond for precision measurement of the components of a magnetic field vector," Technical Physics Letters, Nov. 2015.
Vershovskii & Dmitriev, "Micro-scale three-component quantum magnetometer based on nitrogen-vacancy color centers in diamond crystal," Technical Physics Letters, Apr. 2015.
Wang, et al., "Optimizing ultrasensitive single electron magnetometer based on nitrogen-vacancy center in diamond," Chinese Science Bulletin, Aug. 2013.
Webber, et al., "Ab initio thermodynamics calculation of the relative concentration of NV- and NV0 defects in diamond," Physical Review B, Jan. 2012.
Wolf, et al., "Subpicotesla Diamond Magnetometry," Physical Review X, Oct. 2015.
Wolfe, et al., "Off-resonant manipulation of spins in diamond via precessing magnetization of a proximal ferromagnet," Physical Review B, May 2014.
Xue & Liu, "Producing GHZ state of nitrogen-vacancy centers in cavity QED," Journal of Modern Optics, Mar. 2013.
Yang & Gu, "Novel calibration techniques for high pulsed-magnetic fields using luminescence caused by photo," Journal of Huazhong University of Science and Technology, Jun. 2007.
Yavkin, et al., "Defects in Nanodiamonds: Application of High-Frequency cw and Pulse EPR, ODMR," Applied Magnetic Resonance, Oct. 2014.
Yu, et al., "Bright fluorescent nanodiamonds: no photobleaching and low cytotoxicity," J. Am. Chem. Soc., 2005.
Zhang, et al., "Laser-polarization-dependent and magnetically controlled optical bistability in diamond nitrogen-vacancy centers," Physics Letters A, Nov. 2013.
Zhang, et al., "Laser-polarization-dependent spontaneous emission of the zero phonon line from single nitrogen-vacancy center in diamond," Chinese Physics B, Apr. 2014.
Zhang, et al., "Scalable quantum information transfer between nitrogen-vacancy-center ensembles," Annals of Physics, Apr. 2015.
Zhao, et al., "Atomic-scale magnetometry of distant nuclear spin clusters via nitrogen-vacancy spin in diamond," Nature Nanotechnology, Apr. 2011.
International Preliminary Report on Patentability dated Oct. 20, 2016 from related PCT application PCT/US2015/024723, 7 pages.
U.S. Office Action dated Nov. 2, 2016, from related U.S. Appl. No. 15/003,256, 19 pages.
U.S. Office Action dated Nov. 3, 2016, from related U.S. Appl. No. 15/204,675, 9 pages.
U.S. Office Action dated Oct. 19, 2016, from related U.S. Appl. No. 15/218,821, 6 pages.
Soykal et al., "Quantum metrology with a single spin-3/2 defect in silicon carbide," Mesoscale and Nanoscale Physics (May 24, 2016), 9 pages.
U.S. Office Action dated Aug. 24, 2016 from related U.S. Appl. No. 14/676,740, 19 pages.
U.S. Office Action dated Oct. 14, 2016 from related U.S. Appl. No. 15/003,677, 13 pages.
Widmann et al., "Coherent control of single spins in silicon carbide at room temperature," Nature Materials, 12: 164-168 (2015) (available online Dec. 1, 2014).

Fallah et al., "Multi-sensor approach in vessel magnetic wake imaging," Wave Motion 51(1): 60-76 (Jan. 2014), retrieved from http://www.sciencedirect.com/science/article/pii/S0165200113 (Aug. 21, 2016).
International Search Report and Written Opinion of the International Searching Authority dated Sep. 13, 2016, from related PCT application PCT/US16/14377, 11 pages.
Notice of Allowance dated Sep. 8, 2016, from related U.S. Appl. No. 15/003,298, 10 pages.
Teale, "Magnetometry with Ensembles of Nitrogen Vacancy Centers in Bulk Diamond," Master's Thesis, Massachusetts Institute of Technology Department of Electrical Engineering and Computer Science (Sep. 2015), 57 pages.
U.S. Office Action dated Jul. 29, 2016 from related U.S. Appl. No. 14/680,877, 8 pages.
Bucher et al, "High Resolution Magnetic Resonance Spectroscopy Using Solid-State Spins", May 25, 2017, downloaded from https://arxiv.org/ (arXiv.org > quant-ph > arXiv:1705.08887) on May 25, 2017, pp. 1-24.
International Search Report and Written Opinion of the International Searching Authority dated Jul. 14, 2017, from related PCT application PCT/US2017/022118, 13 pages.
International Search Report and Written Opinion of the International Searching Authority dated Jul. 17, 2017, from related PCT application PCT/US2017/024177, 11 pages.
International Search Report and Written Opinion of the International Searching Authority dated Jul. 18, 2017, from related PCT application PCT/US2017/024167, 11 pages.
International Search Report and Written Opinion of the International Searching Authority dated Jul. 18, 2017, from related PCT application PCT/US2017/024173, 13 pages.
International Search Report and Written Opinion of the International Searching Authority dated Jul. 19, 2017, from related PCT application PCT/US2017/024171, 12 pages.
U.S. Notice of Allowance dated Aug. 11, 2017 from related U.S. Appl. No. 15/003,558, 5 pages.
U.S. Notice of Allowance dated Jul. 18, 2017 from related U.S. Appl. No. 15/003,634, 6 pages.
U.S. Notice of Allowance dated Jul. 24, 2017 from related U.S. Appl. No. 15/003,088, 12 pages.
U.S. Office Action dated Aug. 15, 2017 from related U.S. Appl. No. 15/003,281, 12 pages.
U.S. Office Action dated Jul. 27, 2017 from related U.S. Appl. No. 15/003,577, 15 pages.
Bui et al., "Noninvasive Fault Monitoring of Electrical Machines by Solving the Steady-State Magnetic Inverse Problem," in IEEE Transactions on Magnetics, vol. 44, No. 6, pp. 1050-1053, Jun. 24, 2008.
Chadebec et al., "Rotor fault detection of electrical machines by low frequency magnetic stray field analysis," 2005 5th IEEE International Symposium on Diagnostics for Electric Machines, Power Electronics and Drives, Vienna, 2005, submitted Mar. 22, 2006, pp. 1-6.
Froidurot et al., "Magnetic discretion of naval propulsion machines," in IEEE Transactions on Magnetics, vol. 38, No. 2, pp. 1185-1188, Mar. 2002.
IEEE Std 802.11 TM-2012 Wireless LAN Medium Access Control (MAC) and Physical Layer (PHY) Specifications, 1 page.
Kwon et al., "Analysis of the far field of permanent-magnet motors and effects of geometric asymmetries and unbalance in magnet design," in IEEE Transactions on Magnetics, vol. 40, No. 2, pp. 435-442, Mar. 2004.
Maertz et al., "Vector magnetic field microscopy using nitrogen vacancy centers in diamond", Applied Physics Letters 96, No. 9, Mar. 1, 2010, pp. 092504-1-092504-3.
U.S. Notice of Allowance dated Feb. 2, 2018, from related U.S. Appl. No. 15/003,292, 8 pages.
U.S. Notice of Allowance dated Feb. 21, 2018, from related U.S. Appl. No. 15/003,176, 9 pages.
U.S. Office Action dated Feb. 1, 2018, from related U.S. Appl. No. 15/003,577, 16 pages.
U.S. Office Action dated Feb. 5, 2018, from related U.S. Appl. No. 15/450,504, 12 pages.

(56) References Cited

OTHER PUBLICATIONS

U.S. Office Action dated Jan. 25, 2018, from related U.S. Appl. No. 15/672,953, 28 pages.
U.S. Office Action dated Jan. 26, 2018, from related U.S. Appl. No. 15/003,678, 14 pages.
U.S. Office Action dated Mar. 27, 2018, from related U.S. Appl. No. 15/468,386, 21 pages.
U.S. Office Action dated Mar. 28, 2018, from related U.S. Appl. No. 15/003,177, 12 pages.
U.S. Office Action dated Mar. 5, 2018, from related U.S. Appl. No. 14/866,730, 14 pages.
U.S. Office Action dated Mar. 8, 2018, from related U.S. Appl. No. 15/380,691, 12 pages.
U.S. Office Action dated Mar. 8, 2018, from related U.S. Appl. No. 15/479,256, 30 pages.
Wegerich, "Similarity based modeling of time synchronous averaged vibration signals for machinery health monitoring," 2004 IEEE Aerospace Conference Proceedings (IEEE Cat. No. 04TH8720), 2004, pp. 3654-3662 vol. 6.
Wikipedia, "Continuous phase modulation", downloaded from https://web.archive.org/web/20151017015236/https://en.wikipedia.org/wiki/Continuous_phase_modulation on May 10, 2017, 3 pages.
Wikipedia, "Minimum-shift keying", downloaded from https://web.archive.org/web/20151017175828/https://en.wikipedia.org/wiki/Minimum-shift_keying on May 10, 2017, 2 pages.
U.S. Appl. No. 15/672,953, filed Aug. 9, 2017.
Teeling-Smith et al., "Electron Paramagnetic Resonance of a Single NV Nanodiamond Attached to an Individual Biomolecule", Biophysical Journal 110, May 10, 2016, pp. 2044-2052.
UK Office Action dated Jun. 8, 2018, from related application No. GB1617438.5, 3 pages.
U.S. Final Office Action dated Jul. 26, 2018 from related U.S. Appl. No. 15/003,177, 14 pages.
U.S. Non-Final Office Action dated Aug. 6, 2018 from related U.S. Appl. No. 15/376,244, 28 pages.
U.S. Non-Final Office Action dated Aug. 9, 2018 from related U.S. Appl. No. 15/003,309, 22 pages.
U.S. Non-Final Office Action dated Jul. 20, 2018 from related U.S. Appl. No. 15/350,303, 13 pages.
U.S. Non-Final Office Action dated Jul. 26, 2018 from related U.S. Appl. No. 15/380,419, 11 pages.
U.S. Non-Final Office Action dated Jul. 3, 2018 from related U.S. Appl. No. 15/003,396, 19 pages.
U.S. Notice of Allowance dated Jul. 18, 2018 from related U.S. Appl. No. 15/468,386, 12 pages.
U.S. Notice of Allowance dated Jul. 6, 2018 from related U.S. Appl. No. 15/672,953, 11 pages.
U.S. Notice of Allowance dated Jun. 27, 2018 from related U.S. Appl. No. 15/003,519, 21 pages.
U.S. Notice of Allowance dated May 15, 2018, from related U.S. Appl. No. 15/003,209, 7 pages.
U.S. Notice of Allowance dated May 16, 2018, from related U.S. Appl. No. 15/003,145, 8 pages.
U.S. Office Action dated Jun. 19, 2018, from related U.S. Appl. No. 15/450,504, 12 pages.
European Extended Search Report for Appl. Ser. No. 16740794.9 dated Nov. 12, 2018, 12 pages.
Halbach et al., "Design of Permanent Multipole Magnets with Oriented Rare Earth Cobalt Material", Nuclear Instruments and Methods, North Holland Publishing Co., Amsterdam, NL., vol. 169, Jan. 1, 1980, pp. 1-5, XP001032085, DOI: 10.1016/0029-554X(80)90094-4.
Hodges et al., "Time-keeping with electron spin states in diamond", Dept. of Electrical Engineering and Dept. of Applied Physics and Applied Mathematics, Columbia University, New York, New York 10027, Aug. 30, 2011, 13 pages.
Hodges et al., Appendix, "Time-keeping with electron spin states in diamond", Dept. of Electrical Engineering and Dept. of Applied Physics and Applied Mathematics, Columbia University, New York, New York 10027, Aug. 27, 2012, 46 pages.
International Search Report and Written Opinion for PCT Appl. Ser. No. PCT/US2018/041527 dated Feb. 4, 2019, 22 pages.
US Ex Parte Quayle Action for U.S. Appl. No. 15/468,641 dated Nov. 28, 2018, 11 pages.
U.S. Non-Final Office Action for U.S. Appl. No. 15/003,177 dated Jan. 14, 2019, 15 pages.
U.S. Non-Final Office Action for U.S. Appl. No. 15/003,670 dated Nov. 27, 2018, 14 pages.
U.S. Non-Final Office Action for U.S. Appl. No. 15/382,045 dated Dec. 31, 2018, 16 pages.
U.S. Non-Final Office Action for U.S. Appl. No. 15/468,356 dated Jan. 2, 2019, 10 pages.
U.S. Non-Final Office Action for U.S. Appl. No. 15/468,951 dated Dec. 13, 2018, 9 pages.
U.S. Notice of Allowance for U.S. Appl. No. 15/003,670 dated Feb. 1, 2019, 7 pages.
U.S. Notice of Allowance for U.S. Appl. No. 15/350,303 dated Dec. 26, 2018, 10 pages.
U.S. Notice of Allowance for U.S. Appl. No. 15/450,504 dated Dec. 13, 2018, 7 pages.
U.S. Notice of Allowance for U.S. Appl. No. 15/454,162 dated Jan. 17, 2019, 8 pages.
U.S. Notice of Allowance for U.S. Appl. No. 15/468,397 dated Dec. 12, 2018, 5 pages.
U.S. Notice of Allowance for U.S. Appl. No. 15/468,641 dated Feb. 7, 2019, 10 pages.
U.S. Notice of Allowance for U.S. Appl. No. 15/479,256 dated Feb. 4, 2019, 7 pages.
International Search Report and Written Opinion for PCT Appl. Ser. No. PCT/US2018/041411 dated Feb. 8, 2019, 13 pages.
Schonfeld, "Optical readout of single spins for quantum computing and magnetic sensing", Dissertation, Fachbereich Physlk der Freien Universitat Berlin, May 1, 2011, 21 Pages (relevant pages only), XP055143403. Retrieved from the Internet: URL: http://www.dlss.fu-berlln.de/diss/servlets/MCRFIleNodeServIeUFU Diss_derivate_00000001219 9/DIssertatIon_Slmon-choenfela PublIcVersion-2.pdfJsessionid-89A943688E59.
U.S. Final Office Action for U.S. Appl. No. 15/003,396 dated Mar. 22, 2019, 13 pages.
U.S. Final Office Action for U.S. Appl. No. 15/382,045 dated Apr. 26, 2019, 16 pages.
U.S. Final Office Action for U.S. Appl. No. 15/443,422 dated Mar. 7, 2019, 17 pages.
U.S. Non-Final Office Action for U.S. Appl. No. 15/003,193 dated Apr. 11, 2019, 7 pages.
U.S. Non-Final Office Action for U.S. Appl. No. 15/003,309 dated Feb. 13, 2019, 16 pages.
U.S. Non-Final Office Action for U.S. Appl. No. 15/003,617 dated Feb. 26, 2019, 10 pages.
U.S. Non-Final Office Action for U.S. Appl. No. 15/372,201 dated Apr. 2, 2019, 10 pages.
U.S. Non-Final Office Action for U.S. Appl. No. 15/419,832 dated Feb. 8, 2019, 12 pages.
U.S. Non-Final Office Action for U.S. Appl. No. 15/440,194 dated Feb. 15, 2019, 21 pages.
U.S. Non-Final Office Action for U.S. Appl. No. 15/446,373 dated Apr. 19, 2019, 8 pages.
U.S. Non-Final Office Action for U.S. Appl. No. 15/468,314 dated Mar. 28, 2019, 17 pages.
U.S. Non-Final Office Action for U.S. Appl. No. 15/468,410 dated Apr. 11, 2019, 15 pages.
U.S. Non-Final Office Action for U.S. Appl. No. 15/468,559 dated Apr. 11, 2019, 12 pages.
U.S. Non-Final Office Action for U.S. Appl. No. 15/469,374 dated Feb. 28, 2019, 14 pages.
U.S. Notice of Allowance for U.S. Appl. No. 15/003,617 dated Apr. 30, 2019, 9 pages.
U.S. Notice of Allowance for U.S. Appl. No. 15/207,457 dated Mar. 6, 2019, 16 pages.
U.S. Notice of Allowance for U.S. Appl. No. 15/376,244 dated Feb. 21, 2019, 7 pages.
U.S. Notice of Allowance for U.S. Appl. No. 15/380,419 dated Feb. 26, 2019, 5 pages.

(56) References Cited

OTHER PUBLICATIONS

U.S. Notice of Allowance for U.S. Appl. No. 15/437,038 dated Mar. 21, 2019, 13 pages.
U.S. Notice of Allowance for U.S. Appl. No. 15/437,222 dated Mar. 25, 2019, 11 pages.
U.S. Notice of Allowance for U.S. Appl. No. 15/468,282 dated Feb. 19, 2019, 8 pages.
U.S. Notice of Allowance for U.S. Appl. No. 15/468,356 dated Apr. 22, 2019, 8 pages.
U.S. Notice of Allowance for U.S. Appl. No. 15/468,582 dated Mar. 21, 2019, 13 pages.
U.S. Notice of Allowance for U.S. Appl. No. 15/468,951 dated Mar. 28, 2019, 8 pages.

APPARATUS AND METHOD FOR RECOVERY OF THREE DIMENSIONAL MAGNETIC FIELD FROM A MAGNETIC DETECTION SYSTEM

CROSS-REFERENCE TO RELATED PATENT APPLICATIONS

The present application is a Continuation of U.S. patent application Ser. No. 15/003,718, filed Jan. 21, 2016, which claims the benefit of priority from U.S. Provisional Patent Application No. 62/112,071, filed Feb. 4, 2015, which is incorporated herein by reference in its entirety. This application is related to co-pending U.S. patent application filed Jan. 21, 2016, titled "APPARATUS AND METHOD FOR ESTIMATING ABSOLUTE AXES' ORIENTATIONS FOR A MAGNETIC DETECTION SYSTEM" Ser. No. 15/003,704, which is incorporated by reference herein in its entirety.

TECHNICAL FIELD

The present disclosure generally relates to magnetometers, and more particularly, to apparatuses and methods for the recovery of a three-dimensional (3-D) magnetic field using a single fixed diamond nitrogen vacancy sensor.

BACKGROUND

A number of industrial applications including, but not limited to, medical devices, communication devices, and navigation systems, as well as scientific areas such as physics and chemistry can benefit from magnetic detection and imaging. Many advanced magnetic imaging systems can operate in limited conditions, for example, high vacuum and/or cryogenic temperatures, which can make them inapplicable for imaging applications that require ambient conditions. Furthermore, small size, weight and power (SWAP) magnetic sensors of moderate sensitivity, vector accuracy, and bandwidth are valuable in many applications.

Atomic-sized nitrogen vacancy (NV) centers in diamond lattices have been shown to have excellent sensitivity for magnetic field measurement and enable fabrication of small magnetic sensors that can readily replace existing-technology (e.g., Hall-effect, SERF, SQUID) systems and devices. The sensing capabilities of diamond NV center sensors are maintained in room temperature and atmospheric pressure and these sensors can be even used in liquid environments (e.g., for biological imaging). Measurement of 3-D vector magnetic fields via diamond NV sensing may be beneficial across a very broad range of applications including communications, geological sensing, navigation, and attitude determination.

Currently, methods to measure the full 3-D vector of an external magnetic field are cumbersome and time-consuming. For example, such methods require the use of multiple sensors, each dedicated to measuring one direction of the 3-D vector, which are combined to determine the full magnetic field vector. Other methods utilize a single sensor dedicated to measuring one direction of the magnetic field vector at a time, thereby increasing the time required to determine the full magnetic field vector.

SUMMARY

According to certain embodiments, a system for magnetic detection of an external magnetic field may include a nitrogen vacancy (NV) diamond material comprising a plurality of NV centers, a magnetic field generator configured to generate a magnetic field, a radio frequency (RF) excitation source configured to provide RF excitation to the NV diamond material, an optical excitation source configured to provide optical excitation to the NV diamond material, an optical detector configured to receive an optical signal emitted by the NV diamond material, the optical signal being a fluorescence intensity having a plurality of reduced responses across a frequency range of the RF excitation, and a controller. The controller may be configured to calculate a control magnetic field that separates the plurality of reduced responses in the optical signal emitted by the NV diamond material, control the magnetic field generator to generate the control magnetic field, receive a light detection signal from the optical detector based on the optical signal emitted by the NV diamond material due to the sum of the generated control magnetic field and the external magnetic field, store measurement data based on the received light detection signal, and calculate a vector of the external magnetic field based on the stored measurement data.

According to one aspect, a controller may calculate a control magnetic field that equally separates the plurality of reduced responses.

According to one aspect, a controller may calculate a control magnetic field that maximally separates the plurality of reduced responses.

According to one aspect, a controller may be further configured to calculate an orientation of the NV diamond material.

According to one aspect, a controller may be configured to calculate the orientation of the NV diamond material based on a rotation and/or reflection of a standard orientation of the NV diamond material.

According to one aspect, a controller may be configured to assign a plurality of sign values to the measurement data such that a sum of the measurement data approaches zero.

According to one aspect, a controller may be configured to assign a positive sign value to the largest and smallest measurement data, and a negative sign value to the second-largest and third-largest measurement data.

According to one aspect, a controller may be configured to assign a positive sign value to the largest measurement data, and a negative sign value to the second-largest, third-largest, and smallest measurement data.

According to other embodiments, a system for magnetic detection may include a nitrogen vacancy (NV) diamond material comprising a plurality of NV centers, a magnetic field generator configured to generate a magnetic field, a radio frequency (RF) excitation source configured to provide RF excitation to the NV diamond material, an optical excitation source configured to provide optical excitation to the NV diamond material, an optical detector configured to receive an optical signal emitted by the NV diamond material, the optical signal being a fluorescence intensity having a plurality of reduced responses across a frequency range of the RF excitation, and a controller. The controller may be configured to calculate a control magnetic field that separates the plurality of reduced responses in the optical signal emitted by the NV diamond material, and control the magnetic field generator to generate the control magnetic field.

According to one aspect, a controller may calculate a control magnetic field that equally separates the plurality of reduced responses.

According to one aspect, a controller may calculate a control magnetic field that maximally separates the plurality of reduced responses.

According to one aspect, a controller may be further configured to receive a light detection signal from the optical detector based on the optical signal emitted by the NV diamond material due to the sum of the generated control magnetic field and the external magnetic field, store measurement data based on the received light detection signal, and calculate a vector of the external magnetic field based on the stored measurement data.

According to one aspect, a system may further include a pivot assembly. The magnetic field generator may be affixed to the pivot assembly, the pivot assembly may be configured to position the magnetic field generator to a predetermined orientation such that the magnetic field generator generates the control magnetic field, and the controller may be further configured to control the pivot assembly.

According to other embodiments, a system for magnetic detection of an external magnetic field may include a nitrogen vacancy (NV) diamond material comprising a plurality of NV centers, a radio frequency (RF) excitation source configured to provide RF excitation to the NV diamond material, an optical excitation source configured to provide optical excitation to the NV diamond material, an optical detector configured to receive an optical signal emitted by the NV diamond material, the optical signal being a fluorescence intensity having a plurality of reduced responses across a frequency range of the RF excitation, a magnetic field generator configured to generate a control magnetic field, the control magnetic field being configured to separate the plurality of reduced responses in the optical signal emitted by the NV diamond material, and a controller. The controller may be configured to receive a light detection signal from the optical detector based on the optical signal emitted by the NV diamond material due to the sum of the control magnetic field and the external magnetic field, store measurement data based on the received light detection signal, and calculate a vector of the external magnetic field based on the stored measurement data.

According to one aspect, a control magnetic field may be configured to equally separate the plurality of reduced responses.

According to one aspect, a control magnetic field may be configured to maximally separate the plurality of reduced responses.

According to one aspect, a controller may be further configured to calculate an orientation of the NV diamond material.

According to one aspect, a controller may be configured to calculate the orientation of the NV diamond material based on a rotation and/or reflection of a standard orientation of the NV diamond material.

According to one aspect, a magnetic field generator may be a permanent magnet.

According to one aspect, a system may further include a pivot assembly. The magnetic field generator may be affixed to the pivot assembly, the pivot assembly may be configured to position the magnetic field generator to a predetermined orientation such that the magnetic field generator generates the control magnetic field, and the controller may be further configured to control the pivot assembly.

According to other embodiments, a system for magnetic detection of an external magnetic field may include a nitrogen vacancy (NV) diamond material comprising a plurality of NV centers, a radio frequency (RF) excitation source configured to provide RF excitation to the NV diamond material, an optical excitation source configured to provide optical excitation to the NV diamond material, and an optical detector configured to receive an optical signal emitted by the NV diamond material, the optical signal being a fluorescence intensity having a plurality of reduced responses across a frequency range of the RF excitation. The system may further include a magnetic field generator affixed to a pivot assembly, the pivot assembly being configured to position the magnetic field generator to a predetermined orientation such that the magnetic field generator generates a control magnetic field that separates the plurality of reduced responses in the optical signal emitted by the NV diamond material, and a controller. The controller may be configured to control the pivot assembly to position the magnetic field generator to the predetermined orientation to generate the control magnetic field, receive a light detection signal from the optical detector based on the optical signal emitted by the NV diamond material due to the sum of the control magnetic field and the external magnetic field, store measurement data based on the received light detection signal, and calculate a vector of the external magnetic field based on the stored measurement data.

According to other embodiments, a method for detecting an external magnetic field applied on a nitrogen vacancy (NV) diamond material comprising a plurality of NV centers may include providing radio frequency (RF) excitation to the NV diamond material, providing optical excitation to the NV diamond material, detecting an optical signal emitted by the NV diamond material, the optical signal being a fluorescence intensity having a plurality of reduced responses across a frequency range of the RF excitation, calculating a control magnetic field that separates the plurality of reduced responses in the optical signal emitted by the NV diamond material, applying the control magnetic field to the NV diamond material, receiving a light detection signal based on the optical signal emitted by the NV diamond material due to the sum of the generated control magnetic field and the external magnetic field, storing measurement data based on the received light detection signal, and calculating a vector of the external magnetic field based on the stored measurement data.

According to one aspect, a control magnetic field may separate the plurality of reduced responses.

According to one aspect, a control magnetic field may maximally separate the plurality of reduced responses.

According to one aspect, a method may further include calculating an orientation of the NV diamond material.

According to one aspect, a method may further include calculating the orientation of the NV diamond material is based on a rotation and/or reflection of a standard orientation of the NV diamond material.

According to other embodiments, a system for magnetic detection of an external magnetic field may include a magneto-optical defect center material comprising a plurality of magneto-optical defect centers, a magnetic field generator configured to generate a magnetic field, a radio frequency (RF) excitation source configured to provide RF excitation to the magneto-optical defect center material, an optical excitation source configured to provide optical excitation to the magneto-optical defect center material, an optical detector configured to receive an optical signal emitted by the magneto-optical defect center material, the optical signal being a fluorescence intensity having a plurality of reduced responses across a frequency range of the RF excitation, and a controller. The controller may be configured to calculate a control magnetic field that separates the plurality of reduced responses in the optical signal emitted by the magneto-optical defect center material, control the magnetic field generator to generate the control magnetic field, receive a light detection signal from the optical detector based on the optical signal emitted by the magneto-optical defect center material due to the sum of the generated control magnetic field and the external magnetic field, store measurement data based on the received light detection signal, and calculate a vector of the external magnetic field based on the stored measurement data.

According to one aspect, a controller may calculate a control magnetic field that equally separates the plurality of reduced responses.

According to one aspect, a controller may calculate a control magnetic field that maximally separates the plurality of reduced responses.

According to one aspect, a controller may be further configured to calculate an orientation of the magneto-optical defect center material.

According to one aspect, a controller may be configured to calculate the orientation of the magneto-optical defect center material based on a rotation and/or reflection of a standard orientation of the magneto-optical defect center material.

According to one aspect, a magneto-optical defect center material may be a nitrogen vacancy (NV) diamond material comprising a plurality of NV centers.

According to other embodiments, a system for detecting an external magnetic field acting on a nitrogen vacancy (NV) diamond material comprising a plurality of NV centers may include means for providing radio frequency (RF) excitation to the NV diamond material, means for providing optical excitation to the NV diamond material, means for detecting an optical signal emitted by the NV diamond material, the optical signal being a fluorescence intensity having a plurality of reduced responses across a frequency range of the RF excitation, means for generating a control magnetic field that separates the plurality of reduced responses in the optical signal emitted by the NV diamond material, means for receiving a light detection signal based on the optical signal emitted by the NV diamond material due to the sum of the generated control magnetic field and the external magnetic field, means for storing measurement data based on the received light detection signal, and means for calculating a vector of the external magnetic field based on the stored measurement data.

According to one aspect, a system may further include means for calculating an orientation of the NV diamond material.

DETAILED DESCRIPTION

The present disclosure relates to apparatuses and methods for recovering a full three-dimensional magnetic field from a single diamond NV center sensor system. The method utilizes high accuracy estimation methods for determining the axes orientation of the diamond lattice relative to the sensor system, establishing an optimal bias magnetic field to separate the four Lorentzian responses of the NV center to accurately measure RF shifts due to the external magnetic field, and computing an accurate estimate of the external magnetic field on the sensor system. The apparatuses and methods may utilize only a single sensor from which the full magnetic field vector may be recovered from simple measurements of the Lorentzian responses of the NV center.

The NV Center, its Electronic Structure, and Optical and RF Interaction

Figure 1:
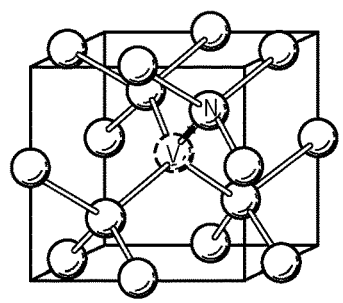
FIG. 1 illustrates one orientation of an NV center in a diamond lattice.

The NV center in a diamond comprises a substitutional nitrogen atom in a lattice site adjacent a carbon vacancy as shown in FIG. 1. The NV center may have four orientations, each corresponding to a different crystallographic orientation of the diamond lattice.

The NV center may exist in a neutral charge state or a negative charge state.

Conventionally, the neutral charge state uses the nomenclature $NV^0$, while the negative charge state uses the nomenclature NV, which is adopted in this description.

The NV center has a number of electrons, including three unpaired electrons, each one from the vacancy to a respective of the three carbon atoms adjacent to the vacancy, and a pair of electrons between the nitrogen and the vacancy. The NV center, which is in the negatively charged state, also includes an extra electron.

Figure 2:
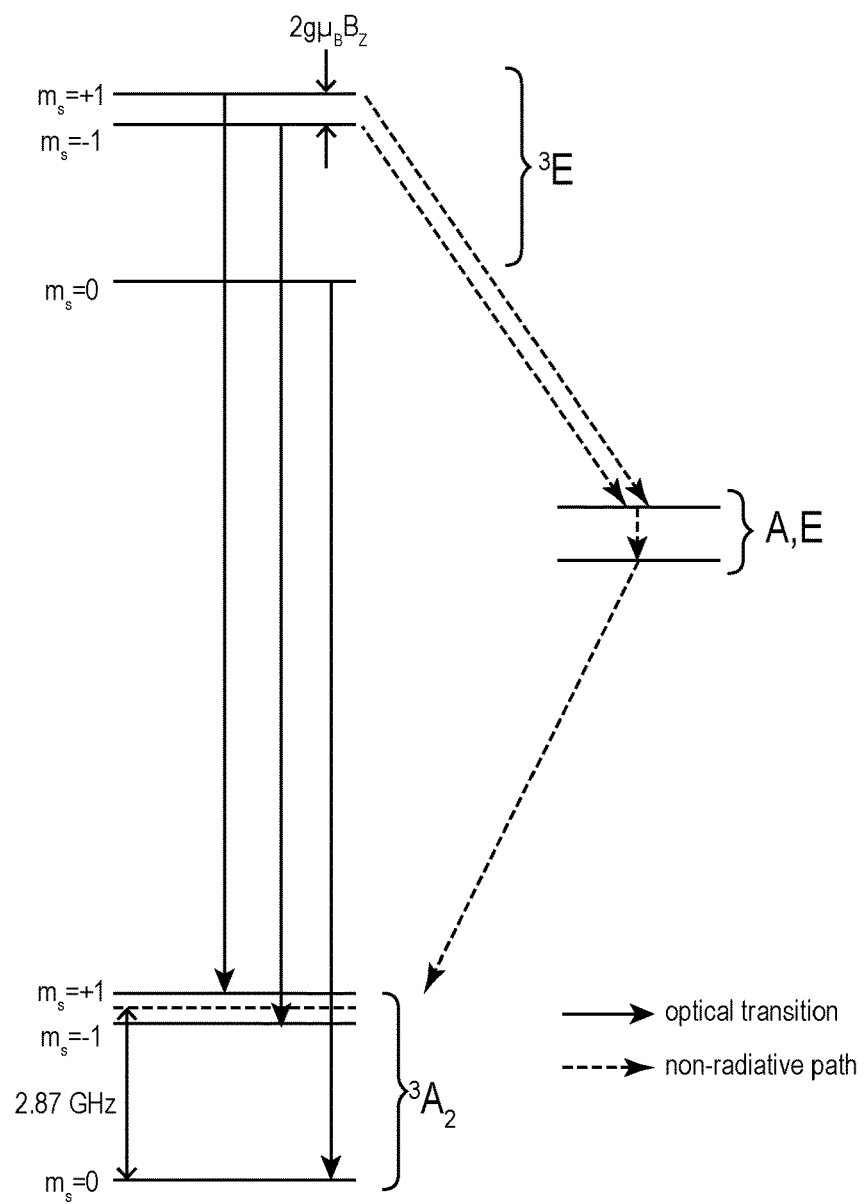
FIG. 2 is an energy level diagram showing energy levels of spin states for the NV center.

The NV center has rotational symmetry, and as shown in FIG. 2, has a ground state, which is a spin triplet with $^3A_2$ symmetry with one spin state $m_s=0$, and two further spin states $m_s=+1$, and $m_s=-1$. In the absence of an external magnetic field, the $m_s=\pm1$ energy levels are offset from the $m_s=0$ due to spin-spin interactions, and the $m_s=\pm1$ energy levels are degenerate, i.e., they have the same energy. The $m_s=0$ spin state energy level is split from the $m_s=\pm1$ energy levels by an energy of 2.87 GHz for a zero external magnetic field.

Introducing an external magnetic field with a component along the NV axis lifts the degeneracy of the $m_s=\pm1$ energy levels, splitting the energy levels $m_s=\pm1$ by an amount $2g\mu_B Bz$, where g is the g-factor, $\mu_B$ is the Bohr magneton, and Bz is the component of the external magnetic field along the NV axis. This relationship is correct to a first order and inclusion of higher order corrections is a straightforward matter and should not affect the computational and logic steps in the systems and methods described below.

The NV center electronic structure further includes an excited triplet state $^3E$ with corresponding $m_s=0$ and $m_s=\pm1$ spin states. The optical transitions between the ground state $^3A_2$ and the excited triplet $^3E$ are predominantly spin conserving, meaning that the optical transitions are between initial and final states that have the same spin. For a direct transition between the excited triplet $^3E$ and the ground state $^3A_2$, a photon of red light is emitted with a photon energy corresponding to the energy difference between the energy levels of the transitions.

There is, however, an alternative non-radiative decay route from the triplet $^3E$ to the ground state $^3A_2$ via intermediate electron states, which are thought to be intermediate singlet states A, E with intermediate energy levels. Significantly, the transition rate from the $m_s=\pm 1$ spin states of the excited triplet $^3E$ to the intermediate energy levels is significantly greater than the transition rate from the $m_s=0$ spin state of the excited triplet $^3E$ to the intermediate energy levels. The transition from the singlet states A, E to the ground state triplet $^3A_2$ predominantly decays to the $m_s=0$ spin state over the $m_s=\pm 1$ spins states. These features of the decay from the excited triplet $^3E$ state via the intermediate singlet states A, E to the ground state triplet $^3A_2$ allow that if optical excitation is provided to the system, the optical excitation will eventually pump the NV center into the $m_s=0$ spin state of the ground state $^3A_2$. In this way, the population of the $m_s=0$ spin state of the ground state $^3A_2$ may be "reset" to a maximum polarization determined by the decay rates from the triplet $^3E$ to the intermediate singlet states.

Another feature of the decay is that the fluorescence intensity due to optically stimulating the excited triplet $^3E$ state is less for the $m_s=\pm 1$ states than for the $m_s=0$ spin state. This is so because the decay via the intermediate states does not result in a photon emitted in the fluorescence band, and because of the greater probability that the $m_s=\pm 1$ states of the excited triplet $^3E$ state will decay via the non-radiative decay path. The lower fluorescence intensity for the $m_s=\pm 1$ states than for the $m_s=0$ spin state allows the fluorescence intensity to be used to determine the spin state. As the population of the $m_s=\pm 1$ states increases relative to the $m_s=0$ spin, the overall fluorescence intensity will be reduced.

The NV Center, or Magneto-Optical Defect Center, Magnetic Sensor System

Figure 3:
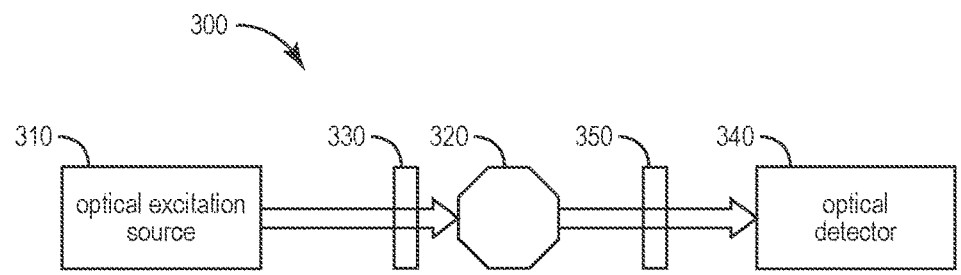
FIG. 3 is a schematic diagram illustrating a conventional NV center magnetic sensor system.

FIG. 3 is a schematic diagram illustrating a conventional NV center magnetic sensor system 300 that uses fluorescence intensity to distinguish the $m_s=\pm 1$ states, and to measure the magnetic field based on the energy difference between the $m_s=+1$ state and the $m_s=-1$ state. The system 300 includes an optical excitation source 310, which directs optical excitation to an NV diamond material 320 with NV centers. The system further includes an RF excitation source 330, which provides RF radiation to the NV diamond material 320. Light from the NV diamond may be directed through an optical filter 350 to an optical detector 340.

The RF excitation source 330 may be a microwave coil, for example. The RF excitation source 330, when emitting RF radiation with a photon energy resonant with the transition energy between ground $m_s=0$ spin state and the $m_s=+1$ spin state, excites a transition between those spin states. For such a resonance, the spin state cycles between ground $m_s=0$ spin state and the $m_s=+1$ spin state, reducing the population in the $m_s=0$ spin state and reducing the overall fluorescence at resonances. Similarly, resonance occurs between the $m_s=0$ spin state and the $m_s=-1$ spin state of the ground state when the photon energy of the RF radiation emitted by the RF excitation source is the difference in energies of the $m_s=0$ spin state and the $m_s=-1$ spin state, or between the $m_s=0$ spin state and the $m_s=+1$ spin state, there is a decrease in the fluorescence intensity.

The optical excitation source 310 may be a laser or a light emitting diode, for example, which emits light in the green, for example. The optical excitation source 310 induces fluorescence in the red, which corresponds to an electronic transition from the excited state to the ground state. Light from the NV diamond material 320 is directed through the optical filter 350 to filter out light in the excitation band (in the green, for example), and to pass light in the red fluorescence band, which in turn is detected by the detector 340. The optical excitation light source 310, in addition to exciting fluorescence in the diamond material 320, also serves to reset the population of the $m_s=0$ spin state of the ground state $^3A_2$ to a maximum polarization, or other desired polarization.

Figure 4:
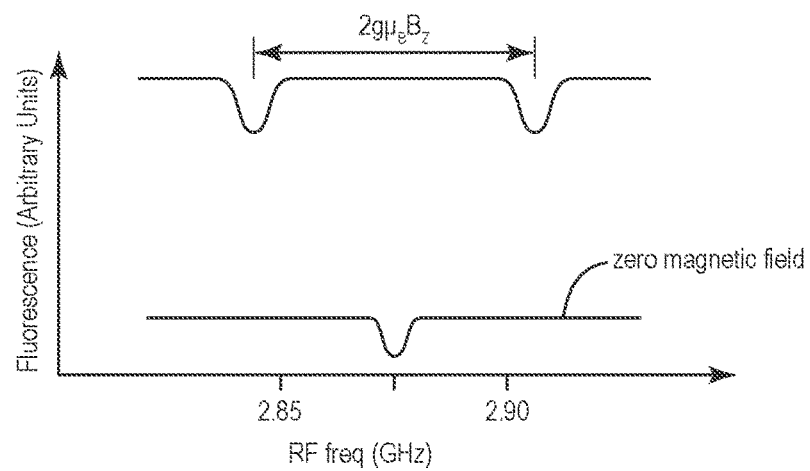
FIG. 4 is a graph illustrating the fluorescence as a function of an applied RF frequency of an NV center along a given direction for a zero magnetic field.

For continuous wave excitation, the optical excitation source 310 continuously pumps the NV centers, and the RF excitation source 330 sweeps across a frequency range that includes the zero splitting (when the $m_s=\pm 1$ spin states have the same energy) energy of 2.87 GHz. The fluorescence for an RF sweep corresponding to a diamond material 320 with NV centers aligned along a single direction is shown in FIG. 4 for different magnetic field components Bz along the NV axis, where the energy splitting between the $m_s=-1$ spin state and the $m_s=+1$ spin state increases with Bz. Thus, the component Bz may be determined. Optical excitation schemes other than continuous wave excitation are contemplated, such as excitation schemes involving pulsed optical excitation, and pulsed RF excitation. Examples of pulsed excitation schemes include Ramsey pulse sequence, and spin echo pulse sequence.

Figure 5:
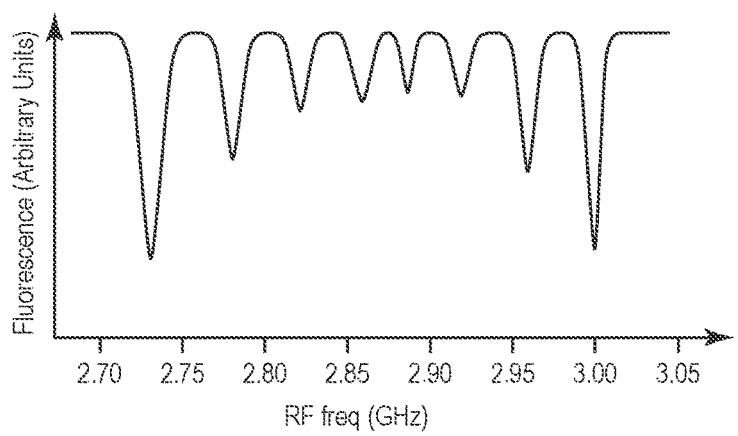
FIG. 5 is a graph illustrating the fluorescence as a function of an applied RF frequency for four different NV center orientations for a non-zero magnetic field.

In general, the diamond material 320 will have NV centers aligned along directions of four different orientation classes. FIG. 5 illustrates fluorescence as a function of RF frequency for the case where the diamond material 320 has NV centers aligned along directions of four different orientation classes. In this case, the component Bz along each of the different orientations may be determined. These results, along with the known orientation of crystallographic planes of a diamond lattice, allow not only the magnitude of the external magnetic field to be determined, but also the direction of the magnetic field.

While FIG. 3 illustrates an NV center magnetic sensor system 300 with NV diamond material 320 with a plurality of NV centers, in general, the magnetic sensor system may instead employ a different magneto-optical defect center material, with a plurality of magneto-optical defect centers. The electronic spin state energies of the magneto-optical defect centers shift with magnetic field, and the optical response, such as fluorescence, for the different spin states is not the same for all of the different spin states. In this way, the magnetic field may be determined based on optical excitation, and possibly RF excitation, in a corresponding way to that described above with NV diamond material.

Figure 6:
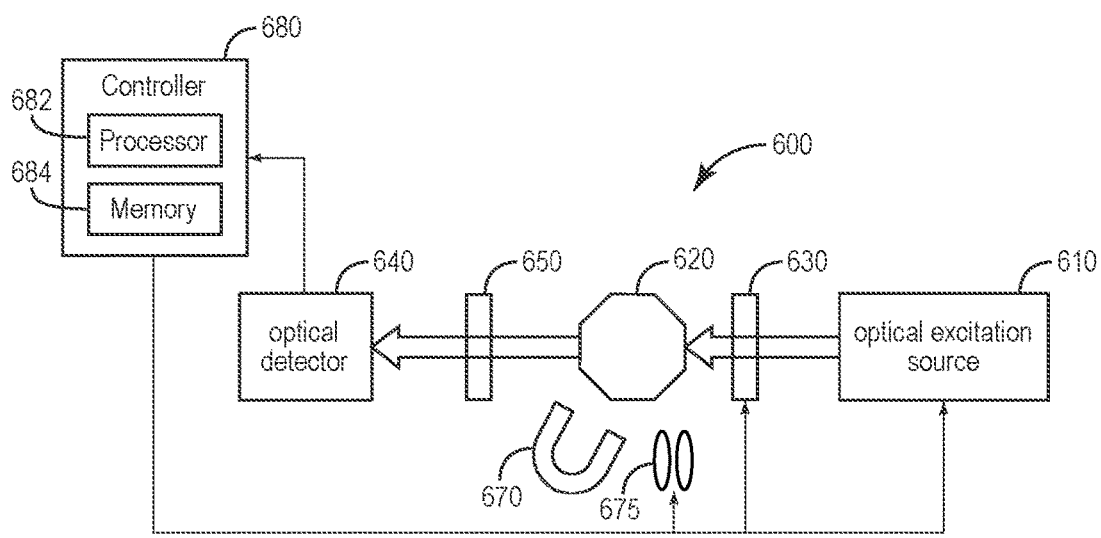
FIG. 6 is a schematic diagram illustrating a magnetic field detection system according to an embodiment.

FIG. 6 is a schematic diagram of a system 600 for a magnetic field detection system according to an embodiment. The system 600 includes an optical excitation source 610, which directs optical excitation to an NV diamond material 620 with NV centers, or another magneto-optical defect center material with magneto-optical defect centers. An RF excitation source 630 provides RF radiation to the NV diamond material 620.

As shown in FIG. 6, a first magnetic field generator 670 generates a magnetic field, which is detected at the NV diamond material 620. The first magnetic field generator 670 may be a permanent magnet positioned relative to the NV diamond material 620, which generates a known, uniform magnetic field (e.g., a bias or control magnetic field) to produce a desired fluorescence intensity response from the NV diamond material 620. In some embodiments, a second magnetic field generator 675 may be provided and positioned relative to the NV diamond material 620 to provide an additional bias or control magnetic field. The second magnetic field generator 675 may be configured to generate magnetic fields with orthogonal polarizations. In this regard, the second magnetic field generator 675 may include one or more coils, such as a Helmholtz coil. The coils may be configured to provide relatively uniform magnetic fields at the NV diamond material 620 and each may generate a magnetic field having a direction that is orthogonal to the direction of the magnetic field generated by the other coils. In some embodiments, only the first magnetic field generator 670 may be provided to generate the bias magnetic field. Alternatively, only the second magnetic field generator 675 may be provided to generate the bias magnetic field.

The system 600 further includes a controller 680 arranged to receive a light detection signal from the optical detector 640 and to control the optical excitation source 610, the RF excitation source 630, and the second magnetic field generator 675. The controller may be a single controller, or multiple controllers. For a controller including multiple controllers, each of the controllers may perform different functions, such as controlling different components of the system 600. The second magnetic field generator 675 may be controlled by the controller 680 via an amplifier 660, for example.

The RF excitation source 630 may be a microwave coil, for example. The RF excitation source 630 is controlled to emit RF radiation with a photon energy resonant with the transition energy between the ground $m_s=0$ spin state and the $m_s=\pm1$ spin states as discussed above with respect to FIG. 3.

The optical excitation source 610 may be a laser or a light emitting diode, for example, which emits light in the green, for example. The optical excitation source 610 induces fluorescence in the red from the NV diamond material 620, where the fluorescence corresponds to an electronic transition from the excited state to the ground state. Light from the NV diamond material 620 is directed through the optical filter 650 to filter out light in the excitation band (in the green, for example), and to pass light in the red fluorescence band, which in turn is detected by the optical detector 640. The optical excitation light source 610, in addition to exciting fluorescence in the NV diamond material 620, also serves to reset the population of the $m_s=0$ spin state of the ground state $^3A_2$ to a maximum polarization, or other desired polarization.

The controller 680 is arranged to receive a light detection signal from the optical detector 640 and to control the optical excitation source 610, the RF excitation source 630, and the second magnetic field generator 675. The controller may include a processor 682 and a memory 684, in order to control the operation of the optical excitation source 610, the RF excitation source 630, and the second magnetic field generator 675. The memory 684, which may include a nontransitory computer readable medium, may store instructions to allow the operation of the optical excitation source 610, the RF excitation source 630, and the second magnetic field generator 675 to be controlled. That is, the controller 680 may be programmed to provide control.

Axes of the Diamond Crystal Lattice

In deriving the total magnetic field vector impinging on the system 600 from the measurements obtained by the intensity response produced by the NV diamond material 620, it is desirable to establish the orientation of the axes of the diamond lattice of the NV diamond material 620 to allow for the accurate recovery of the magnetic field vector and maximize signal-to-noise information. However, as discussed above, the NV diamond material 620 may be arbitrarily oriented and, thus, have axes in an unknown orientation. Thus, in such a case, the controller 680 may be configured to compute an accurate estimation of the true orientation of the NV diamond lattice, which can be performed on-site as a calibration method prior to use. This information can be subsequently used to accurately recover the full vector information of an unknown external magnetic field acting on the system 600.

Figure 7A:
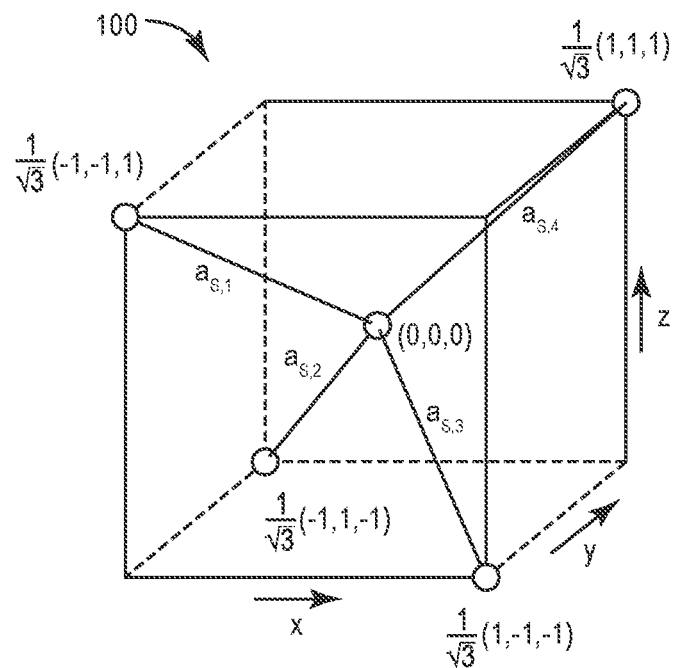
FIG. 7A is a unit cell diagram of the crystal structure of a diamond lattice having a standard orientation.
Figure 7B:
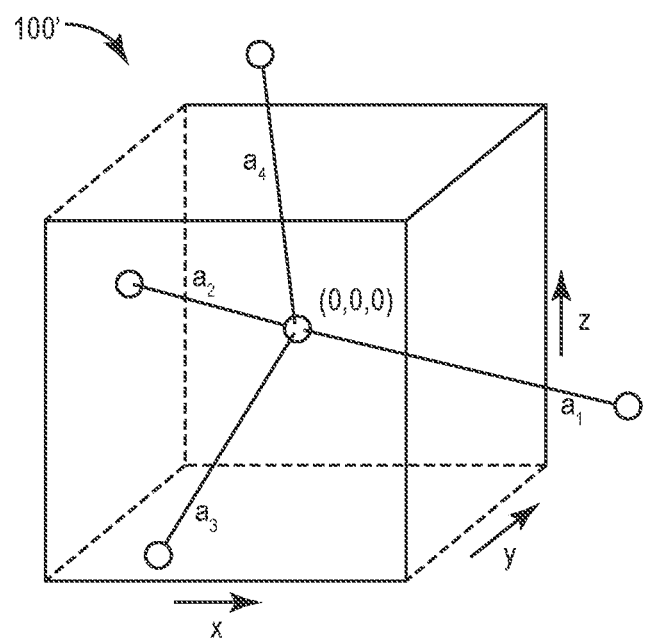
FIG. 7B is a unit cell diagram of the crystal structure of a diamond lattice having an unknown orientation.

To begin, a desired geospatial coordinate reference frame relative to the system 600 by which measurement of the total magnetic field vector will take place is established. As shown in FIGS. 7A and 7B, a Cartesian reference frame having {x, y, z} orthogonal axes may be used, but any arbitrary reference frame and orientation may be used. FIG. 7A shows a unit cell 100 of a diamond lattice having a "standard" orientation. The axes of the diamond lattice will fall along four possible directions. Thus, the four axes in a standard orientation relative to the desired coordinate reference frame may be defined as unit vectors corresponding to:

$$a_{S,1} = \frac{1}{\sqrt{3}}[-1 \;\; -1 \;\; 1]^T \qquad (1)$$

$$a_{S,2} = \frac{1}{\sqrt{3}}[-1 \;\; 1 \;\; -1]^T$$

$$a_{S,3} = \frac{1}{\sqrt{3}}[1 \;\; -1 \;\; -1]^T$$

$$a_{S,4} = \frac{1}{\sqrt{3}}[1 \;\; 1 \;\; 1]^T$$

For simplicity, the four vectors of equation (1) may be represented by a single matrix $A_S$, which represents the standard orientation of the unit cell 100:

$$A_S = [a_{S,1} a_{S,2} a_{S,3} a_{S,4}] \qquad (2)$$

The angle between axis i and axis j may also be given by the $(i,j)^{th}$ row of the following:

$$\cos^{-1}(A_S^T A_S) = \cos^{-1}\begin{bmatrix} 1 & -\frac{1}{3} & -\frac{1}{3} & -\frac{1}{3} \\ -\frac{1}{3} & 1 & -\frac{1}{3} & -\frac{1}{3} \\ -\frac{1}{3} & -\frac{1}{3} & 1 & -\frac{1}{3} \\ -\frac{1}{3} & -\frac{1}{3} & -\frac{1}{3} & 1 \end{bmatrix} \qquad (3)$$

$$\approx \begin{bmatrix} 0° & 109.47° & 109.47° & 109.47° \\ 109.47° & 0° & 109.47° & 109.47° \\ 109.47° & 109.47° & 0° & 109.47° \\ 109.47° & 109.47° & 109.47° & 0° \end{bmatrix}$$

FIG. 7B is a unit cell 100' that represents an arbitrarily placed NV diamond material having unknown axes orientation with respect to the coordinate reference frame. By defining the standard orientation matrix $A_S$ with reference to the established coordinate reference frame, the arbitrary orientation shown in FIG. 7B may be obtained through a rotation and/or reflection of the standard orientation matrix. This can be achieved by applying a transformation matrix R, which is defined as a general 3×3 matrix representing the three-dimensional, orthogonal Cartesian space and is, at this stage, unknown. The transformation matrix may be used to obtain our desired matrix A as follows:

$$A = RA_S \quad (4)$$

Deriving the Total Magnetic Field Vector

As described above with reference to FIGS. 3-5, the total magnetic field acting on the system 600 may be measured fluorescently. These measurements may be modeled as a linear system from which the total magnetic field impinging on the sensor may be determined:

$$m = |A^T b + n| \quad (5)$$

Here, $b \in \mathbb{R}^{3 \times 1}$ represents the magnetic field vector acting inside the sensor system, expressed in Cartesian coordinates relative to the coordinate reference frame; $A^T b$ represents the projection of the magnetic field vector onto each of the four, arbitrarily-placed NV center diamond lattice axes; $n \in \mathbb{R}^{4 \times 1}$ represents the sensor noise vector; and $m \in \mathbb{R}^{4 \times 1}$ represents the measurement vector, where the $i^{th}$ element represents the estimated projection of the magnetic field onto the sensor axis i. In terms of units, it is assumed that the measurement vector has been converted from the DNV sensor's native units (in terms of microwave resonance frequency) into the units of magnetic field strength. Furthermore, the term $|A^T b + n|$ represents the element-wise absolute value of $A^T b + n$, rather than its determinant.

Given the linear model for the magnetic field measurement of equation (5) a least squares estimate of the total magnetic field acting on the system 600 may be given by:

$$\hat{b} = (A^T)^+ m \quad (6)$$

In the above equation, the + superscript denotes the Moore-Penrose pseudoinverse. Because the three four-element columns of $A^T$ are linearly independent, equation (6) may be rewritten as:

$$\begin{aligned}\hat{b} &= (AA^T)^{-1} Am \quad (7)\\ &= (RA_S A_S^T R^T)^{-1} Am \\ &= \left(\frac{4}{3} RIR^T\right)^{-1} Am \\ &= 0.75(RR^T)^{-1} Am\end{aligned}$$

In equation (7), $A_S A_S^T = 4/3 I$ (established in more detail below) has been substituted. Because R is an orthogonal matrix, equation (7) can be reduced to:

$$\hat{b} = 0.75(I)^{-1} Am = 0.75 Am \quad (8)$$

In equations (7)-(8), it was assumed that all the measurements were weighted equally. If, however, some of the axes have less variance in their measurements or are preferred for other reasons, then different weightings may be used for each of the axes for a more optimal least squares estimate. If $w \in \mathbb{R}^{4 \times 1}$ represents the positive weights for each of the measurements and $W = \text{diag}(w)$, then the weighted least-squares formulation for the total magnetic field may be written as:

$$\hat{b} = \text{argmin}_{b \in \mathbb{R}^{3 \times 1}} \|W^{1/2}(A^T b - m)\|_2 \quad (9)$$

Based on equation (9), the generalized least squares solution of equation (6) may now be written as:

$$\hat{b} = (W^{1/2} A^T)^+ W^{1/2} m = (AWA^T)^{-1} AWm \quad (10)$$

For a perfect NV diamond material 620 having no defects (e.g., lattice misalignments, impurities, etc.) and no sensor noise, $\hat{b}$ should be equal to b. However, in an imperfect system, it is possible to utilize a performance metric to determine the error associated with the measurement. One possible metric that may be used is a 2-norm of the residual vector minimized by the least squares solution. This metric $\gamma$ may be given by:

$$\begin{aligned}\gamma &= \|A^T \hat{b} - m\|_2 \quad (11)\\ &= \|A^T (AA^T)^{-1} Am - m\|_2 \\ &= \|(A^T (AA^T)^{-1} A - I) m\|_2\end{aligned}$$

Because the residual vector is proportional to the measurement amplitude, the magnitude of the true magnetic field may be used to normalize the metric to give a consistent metric even in the presence of a changing true magnetic field:

$$\gamma' = \frac{\|(A^T (AA^T)^{-1} A - I) m\|_2}{\|b\|_2} \quad (12)$$

If the true magnetic field is not known, the measurement vector magnitude may be used to normalize the metric:

$$\gamma'' = \frac{\|(A^T (AA^T)^{-1} A - I) m\|_2}{\|m\|_2} \quad (13)$$

Estimation of Absolute Axes' Orientation in the NV Diamond Material

By simple substitution of equation (4) into equation (5), the measurement obtained by the system 600 may be represented in terms of the standard orientation matrix:

$$m = |A^T b + n| = |(RA_S)^T b + n| \quad (14)$$

As described above, a permanent magnet (e.g., the first magnetic field generator 670) and/or coils (e.g., the second magnetic field generator 675) may be used to adequately separate out the Lorentzian dips that correspond to the magnetic field measurements along each diamond axis. However, at this point, the orientations of the sensor's axes are unknown. Thus, the required bias or control magnetic field, defined as $b_{bias}$, that will produce the desired dip separation is unknown.

As will be described in more detail below, there exists a plurality of $b_{bias}$ vectors that can equally separate out the four Lorentzian dips for adequate measurement purposes. Moreover, for the purposes of determining the unknown orientation of the diamond lattice, it is not necessary to precisely place or apply the bias magnetic field that will result in perfectly equal dip separation, which may be more appropriate during field measurement of an external magnetic field. In this case, any $b_{bias}$ vector that sufficiently separates the four dips may suffice for the determination of the unknown orientation of the diamond lattice, thus increasing the viable $b_{bias}$ vectors appropriate for this step. Sufficient spectral dip separation, however, may depend on the width of the dips and the planned magnitude of the calibration magnetic fields (described below). The width of the dips varies, depending on diamond composition and sensor laser and/or RF excitation mechanisms. Based on the resulting widths due to inherent sensor characteristics, the magnitude and orientation should be sufficient to ensure that the anticipated maximum spectral shifts that will occur due to the calibration tests will maintain sufficient separation between neighboring Lorentzian dips.

Figure 8:
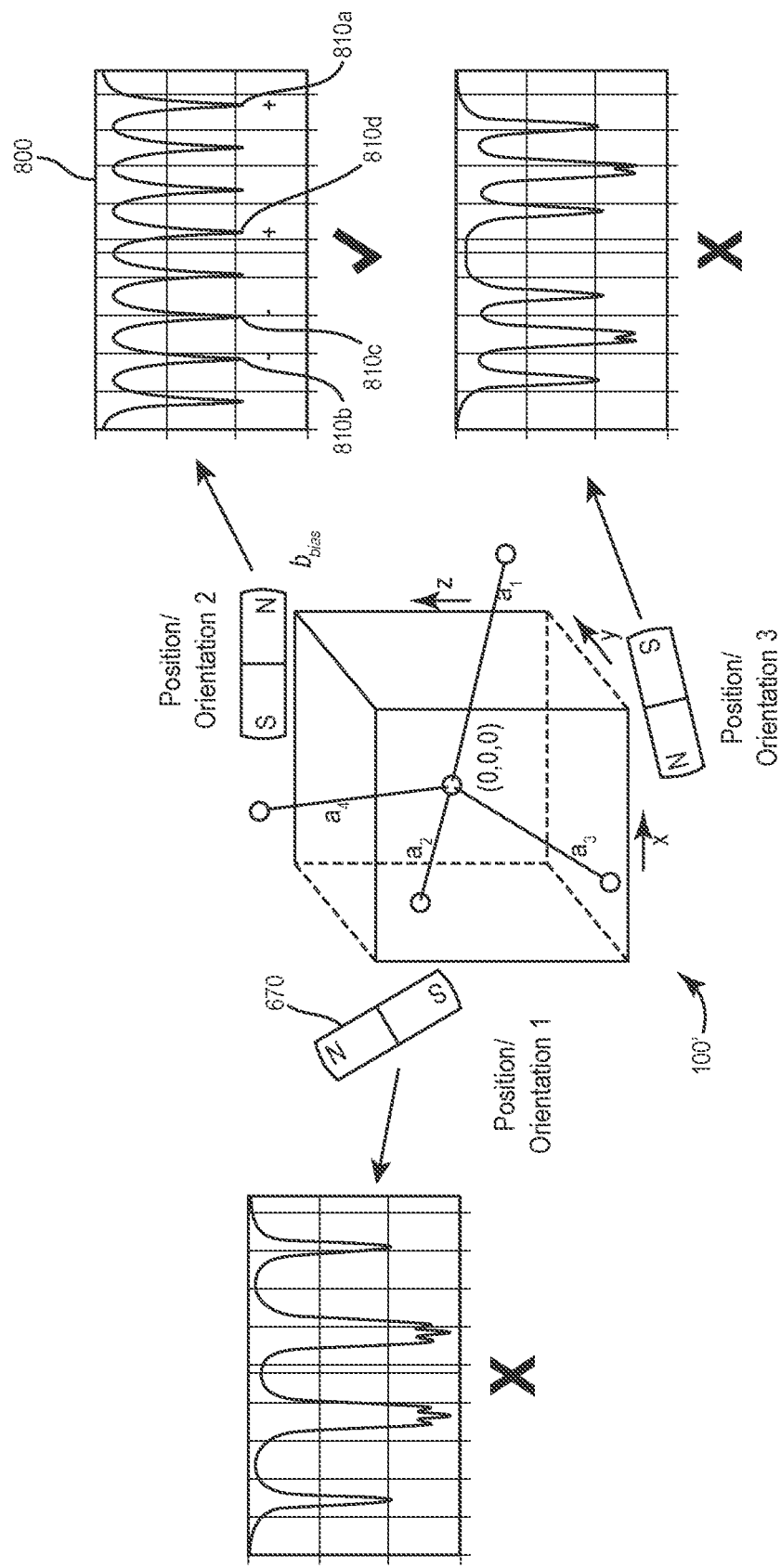
FIG. 8 is a schematic diagram illustrating a step in a method for determining the unknown orientation of the diamond lattice of FIG. 7B.

FIG. 8 shows a step for determining a viable $b_{bias}$ vector field. As shown in FIG. 8, the first magnetic field generator 670 may be arbitrarily placed in one or more positions and/or orientations such that multiple magnetic fields are applied to the diamond having an unknown orientation 100'. Measurements of the fluorescence intensity response are taken for each position and/or orientation of the first magnetic field generator 670. Once a fluorescence intensity response 800 is produced that adequately separates out the four Lorentzian pairs, the position of the first magnetic field generator 670 is maintained and the process may proceed to calibration tests. In other embodiments, the separation process may be performed by the second magnetic field generator 675. In this case, the controller 680 may be configured to control the second magnetic field generator 675 to generate multiple magnetic fields until the desired separation is produced. In yet other embodiments, the first and/or second magnetic field generators may be affixed to a pivot assembly (e.g., a gimbal assembly) that may be controlled to hold and position the first and/or second magnetic field generators to a predetermined and well-controlled set of orientations, thereby establishing the desired Lorentzian separation and/or calibration magnetic fields (described below). In this case, the controller 680 may be configured to control the pivot assembly having the first and/or second magnetic field generators to position and hold the first and/or second magnetic field generators at the predetermined orientation.

After an appropriate calibration $b_{bias}$ field has been found that adequately separates out the four Lorentzian dips, a measurement vector $m_{bias}$ of the corresponding bias magnet's magnetic field projections is collected. The measurement vector may be expressed in a similar manner as the linear model described in equation (5):

$$m_{bias} = |A^T b_{bias} + n_{bias}| \quad (15)$$

As noted above with regard to equation (5), the variables represented in equation (15) are the same, but represented in relation to the applied bias field.

At this point, it is unknown which of the four Lorentzian dips correspond to which of the sensor axes, which still remain unknown. However, because any possible permutation of the axes' ordering can be captured by applying an appropriate orthogonal matrix to $A_S$, and, because the process described herein is estimating the orthogonal matrix that best represents the data, any permutation of the axes' ordering will be compensated by the transformation. Due to this, the axes may be generally assigned such as, for example, the Lorentzian dip that is closest to the zero-field splitting frequency is assigned as $a_1$, the second-closest is assigned as $a_2$, and so on.

Sign Recovery of Magnetic Field Projections

Due to the symmetry of the sensor measurements, the obtained $m_{bias}$ vector has no inherent sign information for each of its four components. However, sign information may be recovered using the following process.

The projections of the magnetic field vector onto the four axes is given by the vector $A^T b$. The sum of the projections may then be initially presumed to equal zero per the following:

$$\sum_{i=1}^{4}(A^T b)_i = \sum_{i=1}^{4}((RA_S)^T b)_i \quad (16)$$

$$= \sum_{i=1}^{4} a_{S,i}^T R^T b$$

$$= b^T R \sum_{i=1}^{4} a_{S,i}$$

$$= b^T R 0$$

$$= 0$$

In the above equation (16), $0 \in \mathbb{R}^{4 \times 1}$ represents a vector consisting of all zeros. If the sum of the elements of a vector $x \in \mathbb{R}^{4 \times 1}$ equals zero, then a magnetic field vector b may be found whose projections onto the four axes of a diamond is identical to x. In this regard, the magnetic field vector b may be defined as follow:

$$b = 0.75 A x \quad (17)$$

The projection of the magnetic field vector b onto the four axes of a diamond may be given by:

$$A^T b = 0.75 A^T A x \quad (18)$$

$$= 0.75 (RA_S)^T RA_S x$$

$$= 0.75 A_S^T R^T R A_S x$$

$$= 0.75 A_S^T A_S x$$

The values for the $A_S$ matrix from equations (1)-(2) may be plugged into equation (18) to give:

$$A^T b = \begin{bmatrix} 0.75 & -0.25 & -0.25 & -0.25 \\ -0.25 & 0.75 & -0.25 & -0.25 \\ -0.25 & -0.25 & 0.75 & -0.25 \\ -0.25 & -0.25 & -0.25 & 0.75 \end{bmatrix} x \quad (19)$$

$$= \left( I - 0.25 \begin{bmatrix} 1 & 1 & 1 & 1 \\ 1 & 1 & 1 & 1 \\ 1 & 1 & 1 & 1 \\ 1 & 1 & 1 & 1 \end{bmatrix} \right) x$$

$$= x - 0.25 \begin{bmatrix} \sum_{i=1}^{4} x_i \\ \sum_{i=1}^{4} x_i \\ \sum_{i=1}^{4} x_i \\ \sum_{i=1}^{4} x_i \end{bmatrix}$$

Because it was initially assumed that the sum of all the elements of x equals 0, equation (19) can be reduced to:

$$A^T b = x - 0.25 \begin{bmatrix} 0 \\ 0 \\ 0 \\ 0 \end{bmatrix} = x \quad (20)$$

Thus, a b vector exists whose projections onto the axes of a diamond is identical to x and the initial presumption of equation (16) is proved. Accordingly, the sum of the axes' projections of any magnetic field impinging on a diamond will be equal to zero, and measurements obtained, in the absence of noise, will sum to zero as well. Thus, sign information for the bias measurements may be recovered following this basic principle. This particular step is especially applicable if the bias magnetic field's projections are much larger than the expected noise levels.

Figure 9:
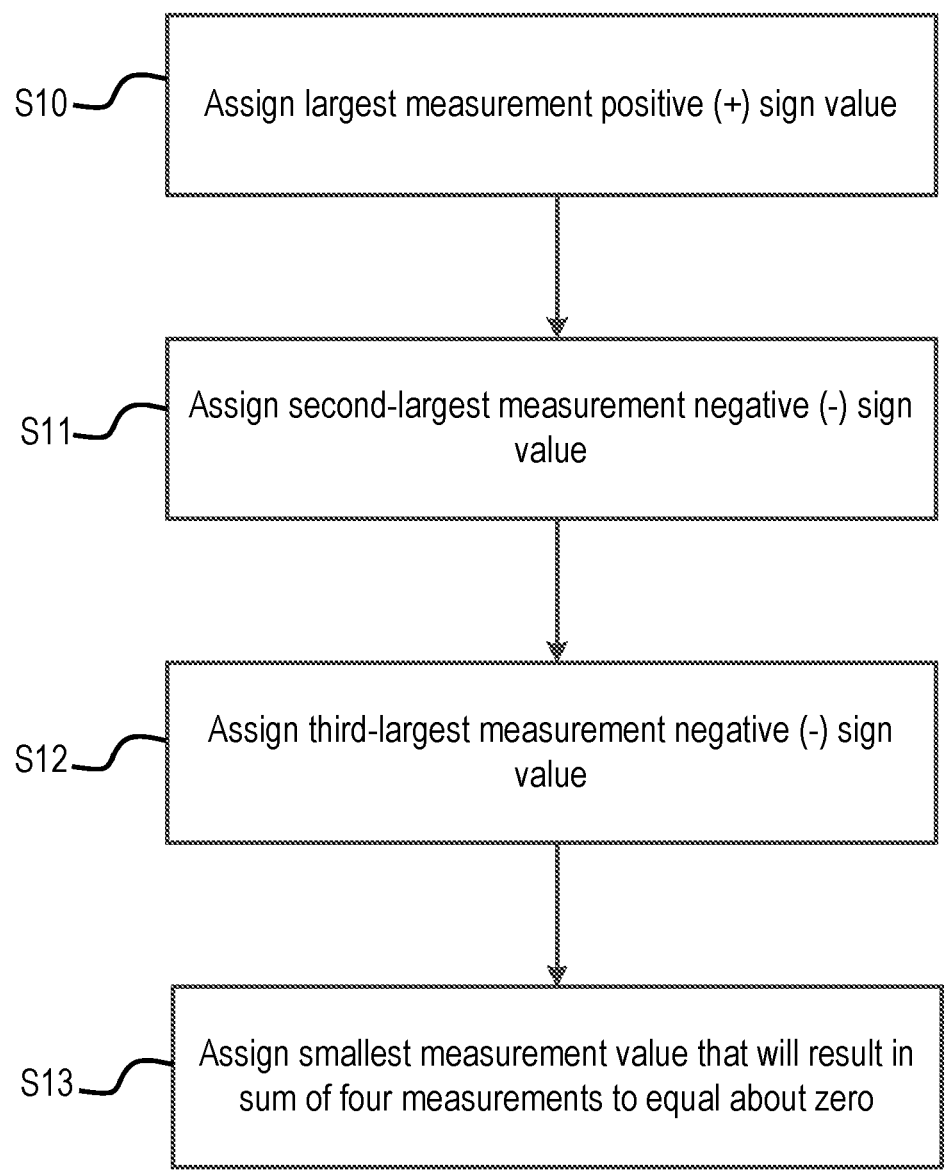
FIG. 9 is a flowchart illustrating a sign recovery method for the method for determining the unknown orientation of the diamond lattice of FIG. 7B.

With reference to FIG. 9, a method to recover sign information from the bias field measurements according to one embodiment will now be described. First, in a step S10, the largest of the four measurements is arbitrarily set to a sign value, either positive or negative. Once this is chosen, the next steps are dictated based on this sign choice such that the principles of equation (16) are maintained. For example, as shown in the embodiment of FIG. 8, the largest of the four measurements, measurement 810a, is assigned as positive. Next, in a step S11, the second-largest measurement (e.g., measurement 810b shown in FIG. 8) is set to negative. By setting the second-largest measurement to negative, the positive value assigned to the largest measurement may be offset toward zero. In a step S12, the third-largest measurement (e.g., measurement 810c of FIG. 8) is assigned a negative sign value. Because, by definition, the second-largest measurement is smaller than the largest measurement, a negative sign value for the third-largest measurement will offset the largest measurement further towards zero. Finally, in a step S13, the smallest measurement is assigned either a positive or negative value that allows for the sum total of the four measurements to approximately equal zero. In FIG. 8, the smallest measurement 810d is assigned a positive value. After this process, therefore, an appropriately signed $m_{bias}$ vector may be obtained.

Figure 10:
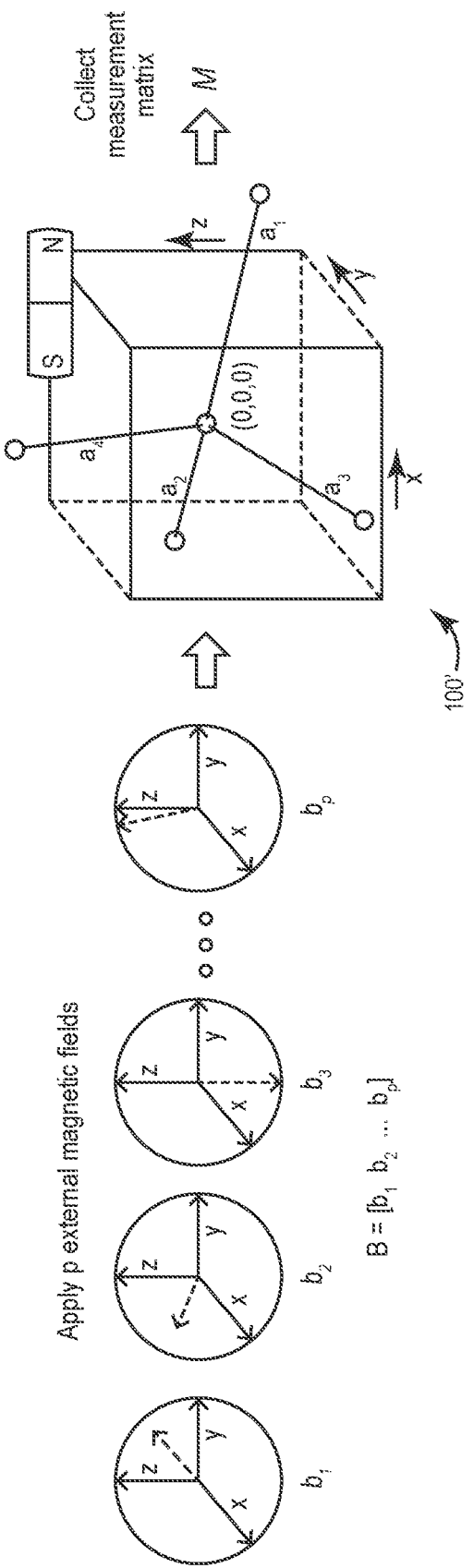
FIG. 10 is a schematic diagram illustrating a step in the method for determining the unknown orientation of the diamond lattice of FIG. 7B.

After application of the bias field that cleanly separates out the four Lorentzian dips and a measurement of the resulting bias field has been collected, a series of calibration tests may be performed. As shown in FIG. 10, a series of p known external magnetic fields, in conjunction with the fixed $b_{bias}$ field, is applied and the resulting sensor measurements are collected. In some embodiments, a series of at least three p (p≥3) weak magnetic fields are applied. In particular embodiments, at least three non-coplanar p weak magnetic fields are applied. In yet other embodiments, three orthogonally spaced p (p≥3) weak magnetic fields are applied. In particular embodiments, four to five p (p=4, 5, . . . ) weak magnetic fields are applied. Such fields may be applied by the second magnetic generator 675 and, thus, controlled by the controller 680. The known applied external magnetic fields may be represented by the following matrix:

$$B = [b_1 b_2 \ldots b_p] \quad (21)$$

In equation (21), $b_k$ represents the $k^{th}$ field for k=1 . . . p. The obtained measurements $m_k$ corresponding to each $b_k$ may be represented by the linear model described above as:

$$m_k = |A^T(b_k + b_{bias}) + n_k| \quad (22)$$

The portion of $m_k$ that corresponds solely to the external magnetic field $b_k$ can be isolated, along with proper sign values, by:

$$\tilde{m}_k = (m_k - |A^T b_{bias}|) \circ \text{sgn}(A^T b_{bias}) \quad (23)$$

In the above equation, ○ represents the Hadamard (i.e., element-wise) matrix product, while sgn( ) represents the element-wise signum function. At this stage, $A^T$ remains unknown. However, $A^T b_{bias}$ may be estimated. This is possible by substituting $\tilde{m}_{bias}$ for $A^T b_{bias}$ in equation (23):

$$\tilde{m}_k \approx (m_k - |\tilde{m}_{bias}|) \circ \text{sgn}(\tilde{m}_{bias}) \quad (24)$$

Combining equations (22) and (23), the derived calibration measurement can be written as follows:

$$\tilde{m}_k = A^T b_k + \tilde{n}_k \quad (25)$$

In the above equation (25), $\tilde{n}_k = n_k \circ \text{sgn}(\tilde{m}_{bias}) + n_{bias}$.

By defining the matrices $\tilde{M} = [\tilde{m}_1 \; \tilde{m}_2 \; \ldots \; \tilde{m}_p]$ and $\tilde{N} = [\tilde{n}_1 \; \tilde{n}_2 \; \ldots \; \tilde{n}_p]$, the external magnetic fields and their corresponding measurements may be compactly represented by:

$$A^T [b_1 b_2 \ldots b_p] + [\tilde{n}_1 \tilde{n}_2 \ldots \tilde{n}_p] = [\tilde{m}_1 \tilde{m}_2 \ldots \tilde{m}_p]$$

$$\Rightarrow A^T B + \tilde{N} = \tilde{M}$$

$$\Rightarrow (RA_S)^T B + \tilde{N} = \tilde{M} \quad (26)$$

Once the known B and the measured $\tilde{M}$ have been obtained, equation (26) may be expanded as follows:

$$(RA_S)^T B + \tilde{N} = \tilde{M}$$

$$\Rightarrow A_S^T R^T B + \tilde{N} = \tilde{M} \quad (27)$$

$$\Rightarrow A_S A_S^T R^T B + A_S \tilde{N} = A_S \tilde{M}$$

$$\Rightarrow \frac{4}{3} I R^T B + A_S \tilde{N} = A_S \tilde{M}$$

$$\Rightarrow R^T B + \frac{3}{4} A_S \tilde{N} = \frac{3}{4} A_S \tilde{M}$$

From equation (19), $A_S A_S^T = 4/3 I$ was demonstrated and thus substituted into equation (27) above. Because the singular values of $A_S$ are known and equal (i.e., about 1.15), the noise term $\tilde{N}$ will not be colored or largely amplified in the expression $\frac{3}{4} A_S \tilde{N}$. Thus, we can treat the expression $\frac{3}{4} A_S \tilde{N}$ as a new noise term:

$$\dot{N} = \frac{3}{4} A_S \tilde{N} \quad (28)$$

Combining equations (27) and (28) results in:

$$R^T B + \dot{N} = \frac{3}{4} A_S \tilde{M} \quad (29)$$

Taking the transpose of both sides of equation (29) gives:

$$B^T R + \dot{N}^T = \frac{3}{4} \tilde{M}^T A_S^T \quad (30)$$

In the next step, an orthogonal matrix $\hat{R}$ is desired that provides the least-squares fit between $B^T$ and $\frac{3}{4} \tilde{M}^T A_S^T$ in equation (30). Some least-squares formulations may introduce translation and/or angular error into the orthogonal matrix $\hat{R}$. For example, error may be introduced when applying the matrix $\hat{R}$ to the standard orientation matrix $A_S$ in the form of a translation of the center of the axes from the standard orientation to the estimated orientation or in a change in the angles shown in equation (3) between given axes. Thus, a least-squares fit that can substantially maintain the relative orientation of the axes to each other when rotating from the standard orientation to the estimated orientation is preferable. In this regard, the orthogonal matrix may be expressed as:

$$\hat{R} = \text{argmin}_{R \in O(3)} \|B^T R - \frac{3}{4} \tilde{M}^T A_S^T\|_F \quad (31)$$

Where, in equation (31), O(3) represents the group of orthogonal 3×3 matrices and $\| \|_F$ represents the Frobenius norm.

By defining the orthogonal matrix $\hat{R}$ as above, the particular problem may be reduced to the Orthogonal Procrustes Problem to solve for $\hat{R}$. First, the following is defined:

$$Z = \frac{3}{4} B \tilde{M}^T A_S^T \quad (32)$$

A singular devalue decomposition of Z is performed to obtain:

$$Z = U \Sigma V^T \quad (33)$$

Where in equation (33), U is an orthogonal 3×3 matrix that contains the left singular vectors of Z; $\Sigma$ is an orthogonal 3×3 matrix that contains the singular values of Z; and $V^T$ is an orthogonal 3×3 matrix that contains the right singular vectors of Z. Given the above, the solution to the Orthogonal Procrustes Problem of (33) is given by:

$$\hat{R} = UV^T \quad (34)$$

Accordingly, with equation (34), an estimate $\hat{R}$ is obtained that may be applied to the standard orientation matrix $A_S$ to give the true axes orientation matrix A. Thus, an estimate $\hat{A}$ of A can be obtained by applying equation (4) to yield:

$$\hat{A} = \hat{R} A_S \quad (35)$$

In the embodiment described above, the Orthogonal Procrustes Problem provides an advantage in reducing translation and/or angular error that may be introduced by the least-squares fit and, thus, provides an accurate estimation of the needed rotation matrix. By accurately estimating the rotation matrix, an accurate estimation of the orientation of an arbitrarily placed lattice structure in a magnetic field detection system having a magneto-optical defect center material is produced. This, in turn, reduces the process to determining the orientation of a diamond in the magnetic detection system 600 to a simple calibration method that may be calculated and controlled by the controller 680 and performed before sensing begins, without the need for pre-manufacturing processes to orient the lattice structure relative to the sensor or additional equipment for visual aid inspection. Moreover, with the above, an accurate estimate of the true orientation of the axes of the NV diamond material 620 may be obtained and recovery of the external magnetic field for magnetic sensing, described further below, may be improved.

Once the axes have been determined using embodiments described above, the bias magnet's magnetic field can subsequently be optimally re-oriented using the methods described below along with the newfound knowledge of the axes' orientations.

Application of the Bias Magnetic Field

Once the orientation of the axes of the diamond lattice has been determined, a bias magnetic field may be applied to cleanly separate out the Lorenztian dips and obtain sign estimates of the magnetic field projections onto the identified diamond lattices.

As noted above, the baseline set of microwave resonance frequencies is defined as those frequencies which are created when no external magnetic field is present. When no bias magnet or bias coil is present (i.e., no bias magnet or bias coil is added internally to the system by, for example, the first and second magnetic field generators 670, 675), the baseline resonance frequencies will be identical for all four diamond axes (e.g., all approximately equal to 2.87 GHz). If a bias magnet or coil is introduced (e.g., applied by the first magnetic field generator 670 and/or second magnetic generator 675), the four axes' baseline resonance frequencies may be uniquely shifted if the projection of the bias magnet's magnetic field onto each of the four axes is unique. By applying a known bias magnetic field, the magnitude and orientation of a non-zero external magnetic field may then be determined by evaluating the additional shift in each axis' microwave resonance frequency relative to the baseline frequency offset, which will be described in more detail below.

For an external magnetic field in the absence of a bias magnetic field, the Lorentzian dips in the microwave resonance spectra that correspond to each of the four axes may overlap significantly. Such overlap can occur when either the projection of the external field onto multiple axes is similar, or when the width of the Lorentzian dips is much larger than the difference in the resonance frequency shifts due to the external magnetic field. In these cases, an external bias magnet applied as part of the system 600 may be used to minimize the overlap by significantly separating the Lorentzian spectral dips, thereby enabling unique recovery of the external magnetic field projections on each of the axes.

The following will describe how an optimal bias magnetic field via the first magnetic field generator 670 (e.g., a permanent magnet) and/or the second magnetic field generator 675 (e.g., three-axis Helmholtz coil system) is calculated by the controller 680 according to one embodiment. Once the optimal bias magnetic field is determined, the orientation of the bias magnet's magnetic field relative to the diamond may then be determined to produce the desired baseline shifts.

Similar to above when determining the orientation of the axes of the diamond lattice, the magnetic field generated by the bias magnet (e.g., the first magnetic field generator 670 and/or the second magnetic field generator 675) may be represented by the vector $b_{bias} \in \mathbb{R}^{3 \times 1}$. As noted above, the projection of the bias magnetic field onto each of the four axes of the diamond is given by $A^T b_{bias}$. The shifted baseline set of microwave resonance frequencies f relative to the centered zero-field splitting frequency (e.g., about 2.87 GHz) may be given by:

$$f = \{ \pm \gamma (A^T b_{bias})_1, \pm \gamma (A^T b_{bias})_2, \pm \gamma (A^T b_{bias})_3, \pm \gamma (A^T b_{bias})_4, \} \quad (36)$$

$$= \{ \pm \gamma a_1^T b_{bias}, \pm \gamma a_2^T b_{bias}, \pm \gamma a_3^T b_{bias}, \pm \gamma a_4^T b_{bias}, \}$$

In equation (36), it is noted that γ represents the nitrogen vacancy gyromagnetic ratio of about 28 GHz/T.

Depending on the characteristics of the sensor and its particular application, optimum performance of the sensor may be achieved under different sets of baseline frequencies. However, not all arbitrary baseline frequency sets may be realizable. Thus, the criteria for producing baseline offsets may be determined from which the corresponding required bias field may be computed.

First, $\bar{f}$ may be defined to represent the desired baseline set of microwave resonance frequencies relative to the centered zero-field splitting frequency and be expressed as follows:

$$\bar{f} = \{ \pm f_1, \pm f_2, \pm f_3, \pm f_4, \} \quad (37)$$

Using equation (36), if a $b_{bias}$ exists that produces $\bar{f}$, then the projections of $b_{bias}$ onto the four axes of the diamond may be given by:

$$a_i^T b_{bias} = -\frac{f_i}{\gamma} \text{ or } \frac{f_i}{\gamma} \text{ for } i = 1 \ldots 4 \quad (38)$$

Regardless of the sign value of the axis projection (i.e., whether positive or negative), the same pair of microwave resonance frequencies $\{-f_i, f_i\}$ will be produced by the system 600. Thus, there is freedom to choose whether each axis projection will be positive or negative without affecting the resulting baseline.

To confirm whether a $b_{bias}$ actually exists that produces f, the concept that a bias field $b_{bias}$ will exist only if the projections of $b_{bias}$ onto the four diamond axes sum to zero is applied, which was shown above as true in equations (16)-(20). Thus, this concept may be expressed as:

$$\sum_{i=1}^{4} a_i^T b_{bias} = \sum_{i=1}^{4} s_i \frac{f_i}{\gamma} = 0, \text{ where } s_{1,2,3,4} \in \{-1, 1\} \quad (39)$$

Accordingly, if a set $\{s_1, s_2, s_3, s_4\}$ can be found that causes the sum in equation (39) to be zero, a $b_{bias}$ vector will exist that produces the desired baseline f. From equation (17) above, $b_{bias}$ may then be given by:

$$b_{bias} = 0.75 A \begin{bmatrix} s_1 \frac{f_1}{\gamma} \\ s_2 \frac{f_2}{\gamma} \\ s_3 \frac{f_3}{\gamma} \\ s_4 \frac{f_4}{\gamma} \end{bmatrix} \quad (40)$$

Once that set $\{s_1, s_2, s_3, s_4\}$ has been determined that results in a $b_{bias}$ vector that produces the desired baseline f, the Lorentzian dips may be fine-tuned to a desired separation by applying the appropriate bias field using the first magnetic field generator 670 and/or the second magnetic field generator 675. For example, equal separation between each pair of adjacent dips in the microwave resonance spectra may be represented by the following baseline set:

$$f = \{\pm\alpha, \pm 3\alpha, \pm 5\alpha, \pm 7\alpha,\} \quad (41)$$

The above equation holds for any $\alpha \in \mathbb{R}$. The separation between any pair of adjacent dips is $2\alpha$. In addition, a possible set $\{s_1, s_2, s_3, s_4\}$ that results in the sum of projections summing to zero is $\{1, -1, -1, 1\}$. Thus, from equations (40) and (41), the $b_{bias}$ that will produce an equally separated baseline set is given by:

$$b_{bias} = 0.75 A \begin{bmatrix} \frac{\alpha}{\gamma} \\ -\frac{3\alpha}{\gamma} \\ -\frac{5\alpha}{\gamma} \\ \frac{7\alpha}{\gamma} \end{bmatrix} \quad (42)$$

Assuming that the diamond is in a standard orientation with respect to the coordinate reference frame (i.e., $A = A_S$), equation (42) will reduce to:

$$b_{bias} = \frac{\alpha\sqrt{3}}{\gamma} \begin{bmatrix} 1 \\ 2 \\ 4 \end{bmatrix} \quad (43)$$

Alternatively, however, the $b_{bias}$ may also be determined after the true axes orientation has been estimated using the methods described above. For example, the $b_{bias}$ that will produce an equally separated baseline set for an arbitrarily orientated diamond will be given by substitution of equation (35) into equation (42) to yield:

$$b_{bias} = 0.75 \hat{R} A_S \begin{bmatrix} \frac{\alpha}{\gamma} \\ -\frac{3\alpha}{\gamma} \\ -\frac{5\alpha}{\gamma} \\ \frac{7\alpha}{\gamma} \end{bmatrix} \quad (44)$$

Maximum separation or a single axis pair of dips in the microwave resonance spectra may also be achieved. The maximum separation may be represented by the following baseline set:

$$f = \{\pm\alpha, \pm\alpha, \pm\alpha, \pm 3\alpha,\} \quad (45)$$

The above equation holds for any $\alpha \in \mathbb{R}$. The separation between the primary pair and the three other peak pairs of adjacent dips will be $2\alpha$. As described above, a possible set $\{s_1, s_2, s_3, s_4\}$ that results in the sum of projections summing to zero is $\{-1, -1, -1, 1\}$. Thus, from equations (40) and (45), the $b_{bias}$ that will produce a maximum single dip separated baseline set is given by:

$$b_{bias} = 0.75 A \begin{bmatrix} -\frac{\alpha}{\gamma} \\ -\frac{\alpha}{\gamma} \\ -\frac{\alpha}{\gamma} \\ \frac{3\alpha}{\gamma} \end{bmatrix} \quad (46)$$

Assuming that the diamond is in a standard orientation with respect to the coordinate reference frame (i.e., $A = A_S$), equation (46) will reduce to:

$$b_{bias} = \frac{4\alpha\sqrt{3}}{\gamma} \begin{bmatrix} 1 \\ 1 \\ 1 \end{bmatrix} \quad (47)$$

It should be noted that equation (47) corresponds directly to one of the four axis orientations, $\alpha_4$.

Alternatively, the $b_{bias}$ may also be determined after the true axes orientation has been estimated using the methods described above. For example, the $b_{bias}$ that will produce a maximum separated baseline set for an arbitrarily orientated diamond will be given by substitution of equation (35) into equation (46) to yield:

$$b_{bias} = 0.75\hat{R}A_S \begin{bmatrix} -\frac{\alpha}{\gamma} \\ -\frac{\alpha}{\gamma} \\ \frac{\alpha}{\gamma} \\ -\frac{\alpha}{\gamma} \\ \frac{3\alpha}{\gamma} \end{bmatrix} \quad (48)$$

Measuring an External Magnetic Field

Once a bias magnet and/or coil with a known bias magnetic field has been applied to the system 600 using the first and/or second magnetic field generators 670, 675 to produce a desired baseline set of microwave resonance frequencies, the magnitude and direction of an external magnetic field may be measured. By defining the external magnetic field at the location of the diamond sensor as $b_{ext} \in \mathbb{R}^{3 \times 1}$, equation (5) may be expressed as:

$$m = |A^T b + n| = |A^T(b_{ext} + b_{bias}) + n| \quad (49)$$

The portion of m that corresponds to the external magnetic field may be isolated by comparing m to the known projections of the bias magnetic field $b_{bias}$, which can be expressed as:

$$m_{ext} = (m - |A^T b_{bias}|) \circ \text{sgn}(A^T b_{bias}) \quad (50)$$

In equation (50), ∘ denotes the Hadamard (element-wise) matrix product. The resulting $m_{ext}$ will have the appropriate sign for the projection of $b_{ext}$ onto each axis, thereby allowing unambiguous recovery of $b_{ext}$ using the approach shown in equations (5)-(13), where $m_{ext}$ is used in place of m to estimate $b_{ext}$.

Figure 11:
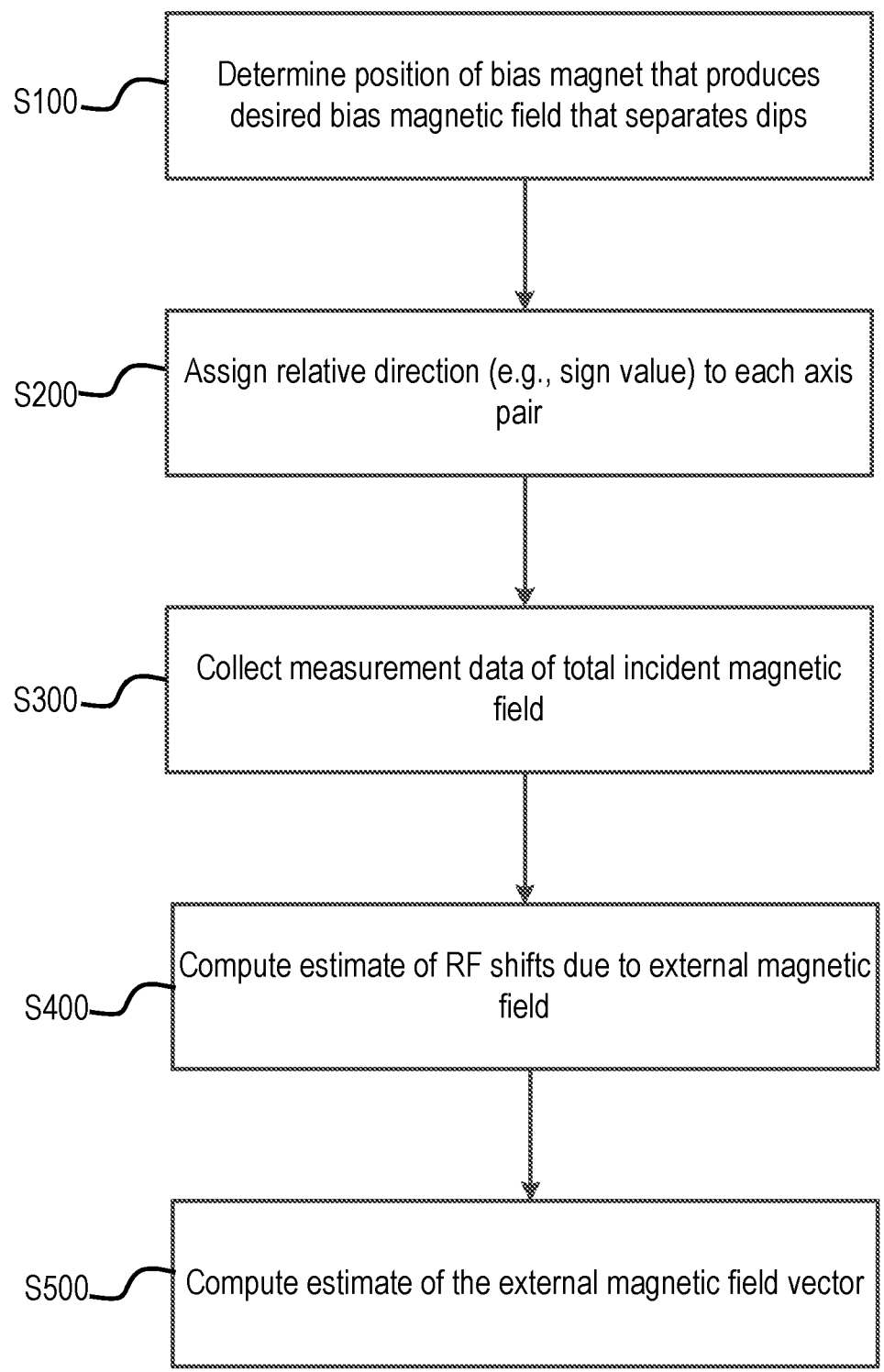
FIG. 11 is a flowchart illustrating a method for recovering a three-dimensional magnetic field on the NV center magnetic sensor system.

Based on the above, an unknown external magnetic field vector may be accurately estimated and recovered. FIG. 11 shows a flowchart illustrating a method for the recovery of an external magnetic field vector as implemented by the controller 680 of the system 600 using the methods described above. In a step S100, the bias magnetic field that will produce the desired separation between the Lorentzian responses for each diamond axis is computed using the methods described above (e.g., equal separation or maximum separation computations). Once this is determined, the first magnetic field generator 670 (e.g., a permanent magnet) may be positioned to produce the desired field or the second magnetic field generator 675 (e.g., three-axis Helmholtz coil) may be controlled by the controller 680 to generate the desired field. Next, in a step S200, a relative direction (i.e., sign value) is assigned to each Lorentzian pair using the sign recovery method described above and shown in FIG. 9.

Once the Lorentzian responses have been optimally separated by the application of an appropriate bias field and sign values of the pairs have been assigned, measurement data of the total magnetic field impinging on the system 600 is collected in a step S300. Then, in a step S400, shifts in the Lorentzian dips due to the external magnetic field are detected and computed based on the linear relationship between the application of the magnetic field vector projected on a given diamond axis and the resulting energy splitting between the $m_s = -1$ spin state and the $m_s = +1$ spin state. In a step S500, this shift information is then used along with the methods described using equations (49)-(50) to compute an estimate of the external magnetic field $b_{ext}$.

The embodiments of the inventive concepts disclosed herein have been described in detail with particular reference to preferred embodiments thereof, but it will be understood by those skilled in the art that variations and modifications can be effected within the spirit and scope of the inventive concepts.

What is claimed is:

1. A system for magnetic detection of an external magnetic field, comprising:
   a magneto-optical defect center material comprising a plurality of magneto-optical defect centers;
   a magnetic field generator configured to generate a magnetic field;
   a radio frequency (RF) excitation source configured to provide RF excitation to the magneto-optical defect center material;
   an optical excitation source configured to provide optical excitation to the magneto-optical defect center material;
   an optical detector configured to receive an optical signal emitted by the magneto-optical defect center material, the optical signal being a fluorescence intensity having a plurality of reduced responses across a frequency range of the RF excitation; and
   a controller configured to:
   calculate a control magnetic field that separates the plurality of reduced responses in the optical signal emitted by the magneto-optical defect center material;
   control the magnetic field generator to generate the control magnetic field;
   receive a light detection signal from the optical detector based on the optical signal emitted by the magneto-optical defect center material due to the sum of the generated control magnetic field and the external magnetic field;
   store measurement data based on the received light detection signal; and
   calculate a vector of the external magnetic field based on the stored measurement data.

2. The system of claim 1, wherein the controller calculates a control magnetic field that equally separates the plurality of reduced responses.

3. The system of claim 1, wherein the controller calculates a control magnetic field that maximally separates the plurality of reduced responses.

4. The system of claim 1, wherein the controller is further configured to calculate an orientation of the magneto-optical defect center material.

5. The system of claim 4, wherein the controller is configured to calculate the orientation of the magneto-optical defect center material based on a rotation and/or reflection of a standard orientation of the magneto-optical defect center material.

6. The system of claim 1, wherein the controller is configured to assign a plurality of sign values to the measurement data such that a sum of the measurement data approaches zero.

7. The system of claim 6, wherein the controller is configured to assign a positive sign value to the largest and smallest measurement data, and a negative sign value to the second-largest and third-largest measurement data.

8. The system of claim 6, wherein the controller is configured to assign a positive sign value to the largest measurement data, and a negative sign value to the second-largest, third-largest, and smallest measurement data.

9. The system of claim 1, further comprising a pivot assembly, wherein the magnetic field generator is affixed to the pivot assembly, the pivot assembly is configured to position the magnetic field generator to a predetermined orientation such that the magnetic field generator generates the calculated control magnetic field, and the controller is further configured to control the pivot assembly.

10. The system of claim 1, wherein the magneto-optical defect center material is a nitrogen vacancy (NV) diamond material.

11. A system for magnetic detection of an external magnetic field, comprising:
a magneto-optical defect center material comprising a plurality of magneto-optical defect centers;
a radio frequency (RF) excitation source configured to provide RF excitation to the magneto-optical defect center material;
an optical excitation source configured to provide optical excitation to the magneto-optical defect center material;
an optical detector configured to receive an optical signal emitted by the magneto-optical defect center material, the optical signal being a fluorescence intensity having a plurality of reduced responses across a frequency range of the RF excitation;
a magnetic field generator configured to generate a control magnetic field, the control magnetic field being configured to separate the plurality of reduced responses in the optical signal emitted by the magneto-optical defect center material; and
a controller configured to:
receive a light detection signal from the optical detector based on the optical signal emitted by the magneto-optical defect center material due to the sum of the control magnetic field and the external magnetic field;
store measurement data based on the received light detection signal; and
calculate a vector of the external magnetic field based on the stored measurement data.

12. The system of claim 11, wherein the control magnetic field is configured to equally separate the plurality of reduced responses.

13. The system of claim 11, wherein the control magnetic field is configured to maximally separate the plurality of reduced responses.

14. The system of claim 11, wherein the controller is further configured to calculate an orientation of the magneto-optical defect center material.

15. The system of claim 14, wherein the controller is configured to calculate the orientation of the magneto-optical defect center material based on a rotation and/or reflection of a standard orientation of the magneto-optical defect center material.

16. The system of claim 11, wherein the magnetic field generator is a permanent magnet.

17. The system of claim 16, further comprising a pivot assembly, wherein the magnetic field generator is affixed to the pivot assembly, the pivot assembly is configured to position the magnetic field generator to a predetermined orientation such that the magnetic field generator generates the control magnetic field, and the controller is further configured to control the pivot assembly.

18. The system of claim 11, wherein the magneto-optical defect center material is a nitrogen vacancy (NV) diamond material.

19. A system for magnetic detection of an external magnetic field, comprising:
a magneto-optical defect center material comprising a plurality of magneto-optical defect centers;
a radio frequency (RF) excitation source configured to provide RF excitation to the magneto-optical defect center material;
an optical excitation source configured to provide optical excitation to the magneto-optical defect center material;
an optical detector configured to receive an optical signal emitted by the magneto-optical defect center material, the optical signal being a fluorescence intensity having a plurality of reduced responses across a frequency range of the RF excitation;
a magnetic field generator affixed to a pivot assembly, the pivot assembly being configured to position the magnetic field generator to a predetermined orientation such that the magnetic field generator generates a control magnetic field that separates the plurality of reduced responses in the optical signal emitted by the magneto-optical defect center material; and
a controller configured to:
control the pivot assembly to position the magnetic field generator to the predetermined orientation to generate the control magnetic field;
receive a light detection signal from the optical detector based on the optical signal emitted by the magneto-optical defect center material due to the sum of the control magnetic field and the external magnetic field;
store measurement data based on the received light detection signal; and
calculate a vector of the external magnetic field based on the stored measurement data.

20. The system of claim 19, wherein the control magnetic field is configured to equally separate the plurality of reduced responses.

21. The system of claim 19, wherein the control magnetic field is configured to maximally separate the plurality of reduced responses.

22. The system of claim 19, wherein the controller is configured to calculate an orientation of the magneto-optical defect center material based on a rotation and/or reflection of a standard orientation of the magneto-optical defect center material.

23. The system of claim 19, wherein the magneto-optical defect center material is a nitrogen vacancy (NV) diamond material.

24. A system for magnetic detection, comprising:
a magneto-optical defect center material comprising a plurality of NV magneto-optical defect centers;
a magnetic field generator configured to generate a magnetic field;
a radio frequency (RF) excitation source configured to provide RF excitation to the magneto-optical defect center material;
an optical excitation source configured to provide optical excitation to the magneto-optical defect center material;
an optical detector configured to receive an optical signal emitted by the magneto-optical defect center material, the optical signal being a fluorescence intensity having a plurality of reduced responses across a frequency range of the RF excitation; and
a controller configured to:
calculate a control magnetic field that separates the plurality of reduced responses in the optical signal emitted by the magneto-optical defect center material; and
control the magnetic field generator to generate the control magnetic field.

25. The system of claim 24, wherein the controller calculates a control magnetic field that equally separates the plurality of reduced responses.

26. The system of claim 24, wherein the controller calculates a control magnetic field that maximally separates the plurality of reduced responses.

27. The system of claim 24, wherein the controller is further configured to:
- receive a light detection signal from the optical detector based on the optical signal emitted by the magneto-optical defect center material due to the sum of the generated control magnetic field and the external magnetic field;
- store measurement data based on the received light detection signal; and
- calculate a vector of the external magnetic field based on the stored measurement data.

28. The system of claim 24, further comprising a pivot assembly, wherein the magnetic field generator is affixed to the pivot assembly, the pivot assembly is configured to position the magnetic field generator to a predetermined orientation such that the magnetic field generator generates the control magnetic field, and the controller is further configured to control the pivot assembly.

29. The system of claim 24, wherein the magneto-optical defect center material is a nitrogen vacancy (NV) diamond material.

30. A method for detecting an external magnetic field applied on a magneto-optical defect center material comprising a plurality of NV centers, comprising:
- providing radio frequency (RF) excitation to the magneto-optical defect center material;
- providing optical excitation to the magneto-optical defect center material;
- detecting an optical signal emitted by the magneto-optical defect center material, the optical signal being a fluorescence intensity having a plurality of reduced responses across a frequency range of the RF excitation;
- calculating a control magnetic field that separates the plurality of reduced responses in the optical signal emitted by the magneto-optical defect center material;
- applying the control magnetic field to the magneto-optical defect center material;
- receiving a light detection signal based on the optical signal emitted by the magneto-optical defect center material due to the sum of the generated control magnetic field and the external magnetic field;
- storing measurement data based on the received light detection signal; and
- calculating a vector of the external magnetic field based on the stored measurement data.

31. The method of claim 30, wherein the control magnetic field separates the plurality of reduced responses.

32. The method of claim 30, wherein the control magnetic field maximally separates the plurality of reduced responses.

33. The method of claim 30, further comprising calculating an orientation of the magneto-optical defect center material.

34. The method of claim 33, wherein calculating the orientation of the magneto-optical defect center material is based on a rotation and/or reflection of a standard orientation of the magneto-optical defect center material.

35. The method of claim 30, wherein the magneto-optical defect center material is a nitrogen vacancy (NV) diamond material.

36. A system for detecting an external magnetic field acting on a magneto-optical defect center diamond material comprising a plurality of NV magneto-optical defect centers, comprising:
- means for providing radio frequency (RF) excitation to the magneto-optical defect center material;
- means for providing optical excitation to the magneto-optical defect center material;
- means for detecting an optical signal emitted by the magneto-optical defect center material, the optical signal being a fluorescence intensity having a plurality of reduced responses across a frequency range of the RF excitation;
- means for generating a control magnetic field that separates the plurality of reduced responses in the optical signal emitted by the magneto-optical defect center material;
- means for receiving a light detection signal based on the optical signal emitted by the magneto-optical defect center material due to the sum of the generated control magnetic field and the external magnetic field;
- means for storing measurement data based on the received light detection signal; and
- means for calculating a vector of the external magnetic field based on the stored measurement data.

37. The system of claim 36, further comprising means for calculating an orientation of the magneto-optical defect center material.

38. The system of claim 36, wherein the magneto-optical defect center material is a nitrogen vacancy (NV) diamond material.

* * * * *